US012727361B2

(12) United States Patent
Kim et al.

(10) Patent No.: US 12,727,361 B2
(45) Date of Patent: Sep. 1, 2026

(54) PHOTOTRANSISTOR, ELECTRONIC DEVICE HAVING THE SAME, AND METHOD OF MANUFACTURING THE PHOTOTRANSISTOR

(71) Applicants: Samsung Display Co., LTD., Yongin-si (KR); Industry-Academic Cooperation Foundation, Yonsei University, Seoul (KR)

(72) Inventors: Taesang Kim, Yongin-si (KR); Hyun Jae Kim, Yongin-si (KR); Hyukjoon Yoo, Yongin-si (KR); Jun Hyung Lim, Yongin-si (KR)

(73) Assignees: SAMSUNG DISPLAY CO., LTD., Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 410 days.

(21) Appl. No.: 18/201,982

(22) Filed: May 25, 2023

(65) Prior Publication Data

US 2024/0065073 A1 Feb. 22, 2024

(30) Foreign Application Priority Data

Aug. 16, 2022 (KR) ........................ 10-2022-0101823

(51) Int. Cl.

| | |
|---|---|
| ***H10K 59/65*** | (2023.01) |
| ***G06V 40/13*** | (2022.01) |
| ***H10F 30/28*** | (2025.01) |
| ***H10F 30/282*** | (2025.01) |
| ***H10F 39/00*** | (2025.01) |

(Continued)

(52) U.S. Cl.

CPC ............ *H10K 59/65* (2023.02); *H10F 30/28* (2025.01); *H10F 30/282* (2025.01); *H10F 39/024* (2025.01); *H10F 71/00* (2025.01); *H10F 77/12* (2025.01); *H10F 77/244* (2025.01); *G06V 40/1318* (2022.01)

(58) Field of Classification Search

CPC .... H10F 30/2823; H10F 30/282; H10F 30/28; H10F 77/12; H10F 77/127; H10F 77/244; H10F 30/24; H10F 39/024; H10K 59/60; H10K 59/65; H10K 59/124

See application file for complete search history.

(56) References Cited

U.S. PATENT DOCUMENTS

| | | | |
|---|---|---|---|
| 9,076,721 | B2 | 7/2015 | Park et al. |
| 11,676,989 | B2 | 6/2023 | Yoo et al. |

(Continued)

FOREIGN PATENT DOCUMENTS

| | | | | |
|---|---|---|---|---|
| EP | 0361515 A2 * | 4/1990 | | H04N 1/02805 |
| KR | 20100095955 A | 9/2010 | | |

(Continued)

*Primary Examiner* — Aaron J Gray

(74) *Attorney, Agent, or Firm* — CANTOR COLBURN LLP

(57) ABSTRACT

A phototransistor includes a gate electrode, a semiconductor layer disposed on the gate electrode, a gate insulating layer disposed between the gate electrode and the semiconductor layer, a source electrode, a drain electrode, and a porous layer disposed on the source electrode, the semiconductor layer, and the drain electrode, where a plurality of holes is defined in the porous layer.

9 Claims, 28 Drawing Sheets

(51) Int. Cl.

| | |
|---|---|
| ***H10F 71/00*** | (2025.01) |
| ***H10F 77/12*** | (2025.01) |
| ***H10F 77/20*** | (2025.01) |

(56) References Cited

U.S. PATENT DOCUMENTS

| | | | | |
|---|---|---|---|---|
| 11,747,924 | B2 | 9/2023 | Kim et al. | |
| 2019/0245011 | A1* | 8/2019 | Lius | G06F 3/0412 |
| 2022/0399421 | A1* | 12/2022 | Hai | G09F 9/33 |

FOREIGN PATENT DOCUMENTS

| | | | |
|---|---|---|---|
| KR | 101207209 | B1 | 12/2012 |
| KR | 101878745 | B1 | 8/2018 |
| KR | 101975929 | B1 | 5/2019 |
| KR | 1020210077848 | A | 6/2021 |
| KR | 102273137 | B1 | 7/2021 |
| KR | 102324296 | B1 | 11/2021 |
| KR | 20220062208 | A | 5/2022 |
| KR | 20220107823 | A | 8/2022 |

* cited by examiner

NPXA
PXA
NPXA
E_AE
EL
HCL
ECL
C_CE
CML
UE
OP1
CH5
CH2
CH1
CNE20
CNE10
CSL
HSc
HSc1
HSc2
HSc
SEa
SCLa
PTG
DEa
PTa
S1
A1
G1
D1
T1
TFE
PDL
70
60
50a
40
30
20
10
BFL
BRL
BL
DP_ED
DP_CL
DR3
DR1

NPXA
PXA
NPXA
E_AE
EL
HCL
ECL
C_CE
CML
UE
CH5
CH2
CH1
CNE20
CNE10
CSL
OP1
HSd
PLb
DEa
PTG
SCLa
SEa
PTa
D1
G1
A1
S1
T1
TFE
PDL
70
60
50
30
20
10
BFL
BRL
BL
DP_ED
DP_CL
DR3
DR1

PHOTOTRANSISTOR, ELECTRONIC DEVICE HAVING THE SAME, AND METHOD OF MANUFACTURING THE PHOTOTRANSISTOR

This application claims priority to Korean Patent Application No. 10-2022-0101823, filed on Aug. 16, 2022, and all the benefits accruing therefrom under 35 U.S.C. § 119, the content of which in its entirety is herein incorporated by reference.

BACKGROUND

1. Field

The disclosure relates to a phototransistor, an electronic device including the same, and a method of manufacturing the phototransistor. More particularly, the disclosure relates to a phototransistor for sensing a light, an electronic device including the phototransistor, and a method of manufacturing the phototransistor.

2. Description of the Related Art

A phototransistor is a device to convert an optical signal into an electrical signal. In such a phototransistor, electrons and holes are generated in a junction between a base and a collector therein by a light, and thus, an output current is obtained.

An electronic device may provide a variety of functions that enable to organically communicate with a user, such as, displaying an image to provide information to the user or sensing an input from the user. Recently, an electronic device may include a function to detect user's biometric information.

As the methods of recognizing the biometric information, various methods, such as a capacitive method that detects a variation in capacitance formed between electrodes, an optical method that detects an incident light using an optical sensor, and an ultrasonic method that detects a vibration using a piezoelectric material, are used.

SUMMARY

The disclosure provides a phototransistor with improved light sensing ability.

The disclosure provides an electronic device including the phototransistor.

The disclosure provides a method of manufacturing the phototransistor with improved light sensing ability.

Embodiments of the invention provide a phototransistor including a gate electrode, a semiconductor layer disposed on the gate electrode, a gate insulating layer disposed between the gate electrode and the semiconductor layer, a source electrode disposed on the semiconductor layer, a drain electrode disposed on the semiconductor layer and spaced apart from the source electrode on the semiconductor layer, and a porous layer disposed on the source electrode, the semiconductor layer and the drain electrode, where a plurality of holes is defined in the porous layer.

In an embodiment, the semiconductor layer may include an oxide semiconductor.

In an embodiment, the porous layer may include an organic material.

In an embodiment, the porous layer may include a first sub-porous layer including an organic material and a second sub-porous layer disposed on the first sub-porous layer and including an inorganic material, and the holes may include a first sub-hole defined through the second sub-porous layer and a second sub-hole defined through the first sub-porous layer.

In an embodiment, the phototransistor may further include a protective layer disposed on the porous layer.

In an embodiment, a portion of the semiconductor layer where the semiconductor layer overlaps the source electrode and the drain electrode may be defined as a first portion, a portion of the semiconductor layer where the semiconductor layer does not overlap the source electrode and the drain electrode may be defined as a second portion, and the holes may overlap the first and second portions.

In an embodiment, the source electrode and the drain electrode may include a transparent conductive material.

In an embodiment, the holes may be arranged spaced apart from each other when viewed in a plan view, and the holes may have a same size as each other when viewed in the plan view.

In an embodiment, the holes may be defined through the porous layer.

Embodiments of the invention provide an electronic device including a base layer, a display element layer including a light emitting element, and a circuit layer disposed between the base layer and the display element layer. In such embodiments, the circuit layer includes a pixel driving circuit electrically connected to the light emitting element and a phototransistor having a light sensing function, and the phototransistor includes a gate electrode, a semiconductor layer disposed on the gate electrode, a gate insulating layer disposed between the gate electrode and the semiconductor layer, a source electrode disposed on the semiconductor layer, a drain electrode disposed on the semiconductor layer and spaced apart from the source electrode on the semiconductor layer, and a porous layer disposed on the source electrode, the semiconductor layer and the drain electrode, where a plurality of holes is defined in the porous layer.

In an embodiment, the semiconductor layer may include an oxide semiconductor.

In an embodiment, the porous layer may include an organic material.

In an embodiment, the porous layer may include a first sub-porous layer including an organic material and a second sub-porous layer disposed on the first sub-porous layer and including an inorganic material, and the holes may be defined through the first and second sub-porous layers.

In an embodiment, the electronic device may further include a protective layer disposed on the porous layer.

Embodiments of the invention provide an electronic device including a window, a display module disposed under the window, a sensing unit disposed under the display module, and a housing coupled with the window, where the display module and the sensing unit are accommodated in housing. In such embodiments, the sensing unit includes a phototransistor having a light sensing function. The phototransistor includes a gate electrode, a semiconductor layer disposed on the gate electrode, a gate insulating layer disposed between the gate electrode and the semiconductor layer, a source electrode disposed on the semiconductor layer, a drain electrode disposed on the semiconductor layer and spaced apart from the source electrode on the semiconductor layer, and a porous layer disposed on the source electrode, the semiconductor layer and the drain electrode, where a plurality of holes is defined in the porous layer.

In an embodiment, the semiconductor layer may include an oxide semiconductor.

In an embodiment, the porous layer may include an organic material.

In an embodiment, the porous layer may include a first sub-porous layer including an organic material and a second sub-porous layer disposed on the first sub-porous layer and including an inorganic material, and the holes may be defined through the first and second sub-porous layers.

Embodiments of the invention provide a method of manufacturing a phototransistor. In such embodiments, the manufacturing method includes forming a gate electrode on a substrate, forming a gate insulating layer on the gate electrode, forming a semiconductor layer on the gate insulating layer, forming a source electrode and a drain electrode on the semiconductor layer, where the source electrode and the drain electrode are spaced apart from each other on the semiconductor layer, and forming a porous layer, in which a plurality of holes is defined to expose the semiconductor layer, on the source electrode, the semiconductor layer and the drain electrode.

In an embodiment, the forming the porous layer may include forming an organic layer on the source electrode, the semiconductor layer, and the drain electrode, dispersing nanoparticles on the organic layer, forming an inorganic layer on the organic layer to fix the nanoparticles to the organic layer, removing the nanoparticles to form a first sub-porous layer of the porous layer, and patterning the organic layer using the first sub-porous layer as a mask to form a second sub-porous layer of the porous layer.

In an embodiment, the first sub-porous layer may have a thickness smaller than a diameter of the nanoparticles.

In an embodiment, the forming of the porous layer may further include aligning the nanoparticles using a magnetic field after the dispersing the nanoparticles on the organic layer.

In an embodiment, the method may further include forming a protective layer on the porous layer.

In an embodiment, the removing the nanoparticles may include using a polymer roller.

In an embodiment, the removing the nanoparticles may include selectively etching the nanoparticles through a dry etching process or a wet etching process.

According to embodiments of the invention, as the phototransistor includes the porous layer, an amount of external light provided to the semiconductor layer increases by collecting or internally scattering the external light provided to the phototransistor.

According to embodiments of the invention, a light absorption rate of the phototransistor may be effectively controlled by adjusting the size and the number of the holes provided through the porous layer.

BRIEF DESCRIPTION OF THE DRAWINGS

The above and other features of embodiments of the disclosure will become readily apparent by reference to the following detailed description when considered in conjunction with the accompanying drawings, in which.

DETAILED DESCRIPTION

Figure 1A:
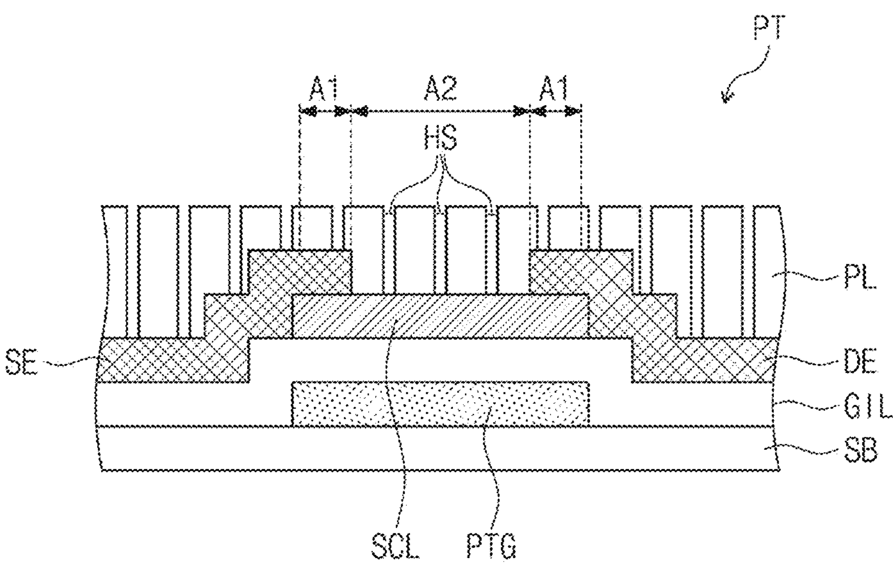
FIG. 1A is a cross-sectional view of a phototransistor according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" may include any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein Spatially relative terms, such as "beneath", "below", "lower", "above", "upper" and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," or "include" and/or "including", when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 1B:
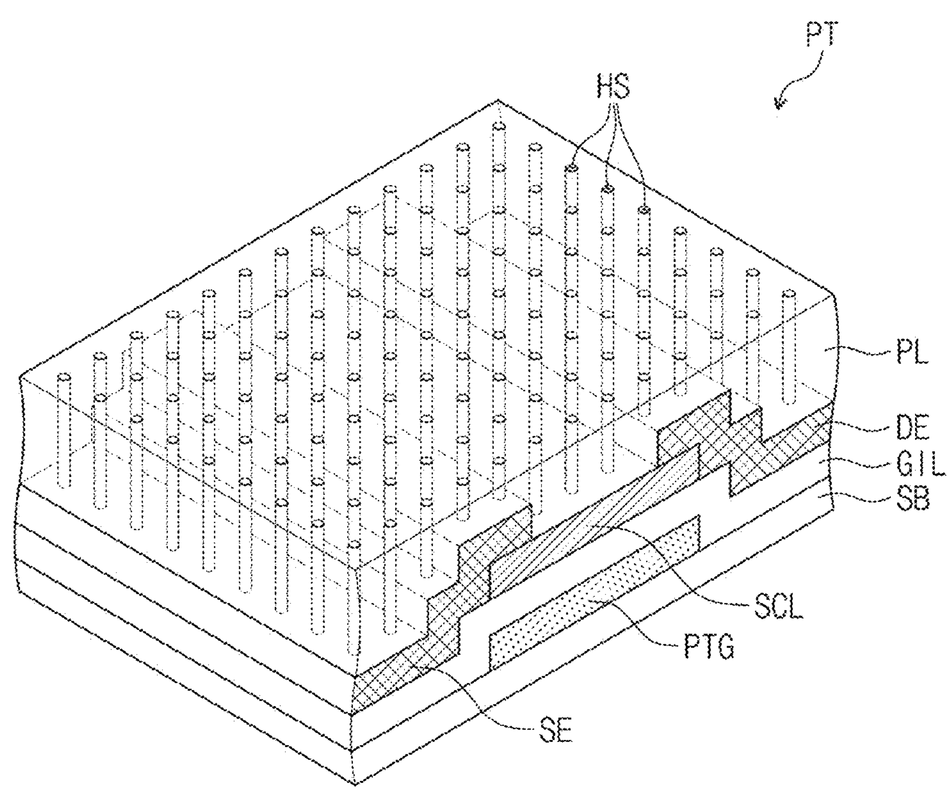
FIG. 1B is a perspective view of the phototransistor of FIG. 1A.

FIG. 1A is a cross-sectional view of a phototransistor PT according to an embodiment of the disclosure, and FIG. 1B is a perspective view of the phototransistor PT of FIG. 1A.

Referring to FIGS. 1A and 1B, an embodiment of the phototransistor PT may include a substrate SB, a gate electrode PTG, a gate insulating layer GIL, a semiconductor layer SCL, a source electrode SE, a drain electrode DE, and a porous layer PL.

The substrate SB may be a base layer providing a surface on which the gate electrode PTG is disposed. The substrate SB may be a semiconductor substrate, e.g., a silicon substrate or a compound semiconductor substrate. In an embodiment, the substrate SB may be a P-type semiconductor substrate (e.g., a $P^{++}$ semiconductor substrate) or a silicon dioxide ($SiO_2$) substrate, however, it should not be limited thereto or thereby. According to an alternative embodiment, the substrate SB may be a glass substrate, a metal substrate, or an organic/inorganic composite material substrate.

The gate electrode PTG may be disposed on the substrate SB. The gate electrode PTG may be an electrode pattern formed by patterning a conductive material on the substrate SB. According to an embodiment, the gate electrode PTG may include titanium (Ti), silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), indium tin oxide (ITO), indium zinc oxide (IZO), or the like, however, it should not be particularly limited.

The gate insulating layer GIL may be disposed on the substrate SB to cover the gate electrode PTG. The gate insulating layer GIL may include an insulating material. In an embodiment, the gate insulating layer GIL may include silicon oxide or silicon nitride, however, it should not be limited thereto or thereby. According to an embodiment, the gate insulating layer GIL may include an inorganic layer and/or an organic layer and may have a single-layer or multi-layer structure. According to an embodiment, the gate insulating layer GIL may include silicon dioxide ($SiO_2$).

The semiconductor layer SCL may be disposed on the gate insulating layer GIL. The semiconductor layer SCL may be disposed on the gate insulating layer GIL to face (or overlap) the gate electrode PTG. The source electrode SE and the drain electrode DE may be disposed on the gate insulating layer GIL and the semiconductor layer SCL. The source electrode SE and the drain electrode DE may be spaced apart from each other on the semiconductor layer SCL. According to an embodiment, the source electrode SE may be in contact with one side of the semiconductor layer SCL, and the drain electrode DE may be in contact with another side (e.g., a side opposite to the one side) of the semiconductor layer SCL. The source electrode SE and the drain electrode DE may be on opposing side portions of the semiconductor layer SCL, respectively, and extend therefrom in directions opposite to each other. Each of the source electrode SE and the drain electrode DE may include a metal material, and the metal material may include copper (Cu), aluminum (Al), nickel (Ni), or chromium (Cr), but it should not be limited thereto or thereby.

According to an embodiment, as a portion of the source electrode SE and a portion of the drain electrode DE are disposed on the semiconductor layer SCL, the source electrode SE and the drain electrode DE may partially overlap the semiconductor layer SCL when viewed in a plan view (e.g., a top plan view) or when view in a thickness direction of the substrate SB). Accordingly, the phototransistor PT may include a first area A1 in which the semiconductor layer SCL overlaps the source electrode SE and the drain electrode DE and a second area A2 in which the semiconductor layer SCL does not overlap the source electrode SE and the drain electrode DE. According to an embodiment, the semiconductor layer SCL may have a thickness of about 43.8 nanometers (nm). In an alternative embodiment, the semiconductor layer SCL may not overlap the source electrode SE and the drain electrode DE when viewed in the plan view. In such an embodiment, the semiconductor layer SCL may be disposed in (or directly on) a same layer as the source electrode SE and the drain electrode DE and may be disposed between the source electrode SE and the drain electrode DE.

The semiconductor layer SCL may include or be formed of crystalline silicon, amorphous silicon, or oxide semiconductor. According to an embodiment, the semiconductor layer SCL may include a crystalline or amorphous oxide semiconductor. In an embodiment, for example, the oxide semiconductor may include a metal oxide of a metal, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like. The oxide semiconductor has superior light sensing properties compared with crystalline silicon and amorphous silicon. However, the oxide semiconductor has a large band gap of about 3.0 electronvolts (eV) or more, and as a result, the oxide semiconductor may transmit a light in the visible region and the infrared regions without absorbing the light.

Referring to FIGS. 1A and 1B, in an embodiment, the porous layer PL, through which a plurality of holes HS is defined, may be disposed on the semiconductor layer SCL. According to an embodiment, the porous layer PL may be an organic layer including an organic material, however, it should not be particularly limited. According to an alternative embodiment, the porous layer PL may be an inorganic layer including an inorganic material or may have a stack structure in which an organic layer and an inorganic layer are stacked. In an embodiment, for example, the porous layer PL may have a thickness of about 20 nm.

Referring to FIG. 1B, the holes HS may be arranged spaced apart from each other when viewed in the plan view. In an embodiment, for example, the holes HS may be arranged to be spaced apart from each other at regular intervals when viewed in the plan view, however, they should not be limited thereto or thereby. According to an alternative embodiment, the holes HS may be arranged at irregular or different intervals. According to an embodiment, the holes HS may have a same size as each other when viewed in the plan view. In an embodiment, for example, the size of the holes HS may be equal to or greater than about 10 nm and equal to or smaller than about 1000 nm, however, it should not be limited thereto or thereby. According to an embodiment, the holes HS may have different sizes from each other when viewed in the plan view. According to an embodiment, the holes HS may be formed through the porous layer PL, however, they should not be limited thereto or thereby. According to an embodiment, the holes HS may be formed partially in the porous layer PL by recessing a portion of the porous layer PL from an upper surface of the porous layer PL.

According to an embodiment, the source electrode SE and the drain electrode DE may include a transparent conductive material. In such an embodiment, an external light incident into the first area A1 may be provided to the semiconductor layer SCL after passing through the source electrode SE and the drain electrode DE. The holes HS may be formed to overlap the first area A1 and the second area A2 to collect or guide the external light to the semiconductor layer SCL. Alternatively, the holes HS may be formed over an entire area of the porous layer PL in addition to the first area A1 and the second area A2.

In a case where the source electrode SE and the drain electrode DE include a metal material, the external light may not pass through the source electrode SE and the drain electrode DE. Accordingly, in such a case where the source electrode SE and the drain electrode DE include the metal material, the external light incident into the first area A1 may not pass through the source electrode SE and the drain electrode DE and may not be incident into the semiconductor layer SCL. In this case, the holes HS of the porous layer PL may be formed only in the second area A2 in which the source electrode SE and the drain electrode DE do not overlap the semiconductor layer SCL.

According to an embodiment, as the porous layer PL is provided with the holes HS, an amount of the external light provided to the semiconductor layer SCL may increase by collecting the external light provided to the phototransistor PT or by internally scattering the external light provided to the phototransistor PT. In such an embodiment, a light absorption rate of the phototransistor PT may be controlled by adjusting the size and the number of the holes HS defined or formed through the porous layer PL.

Figure 2A:
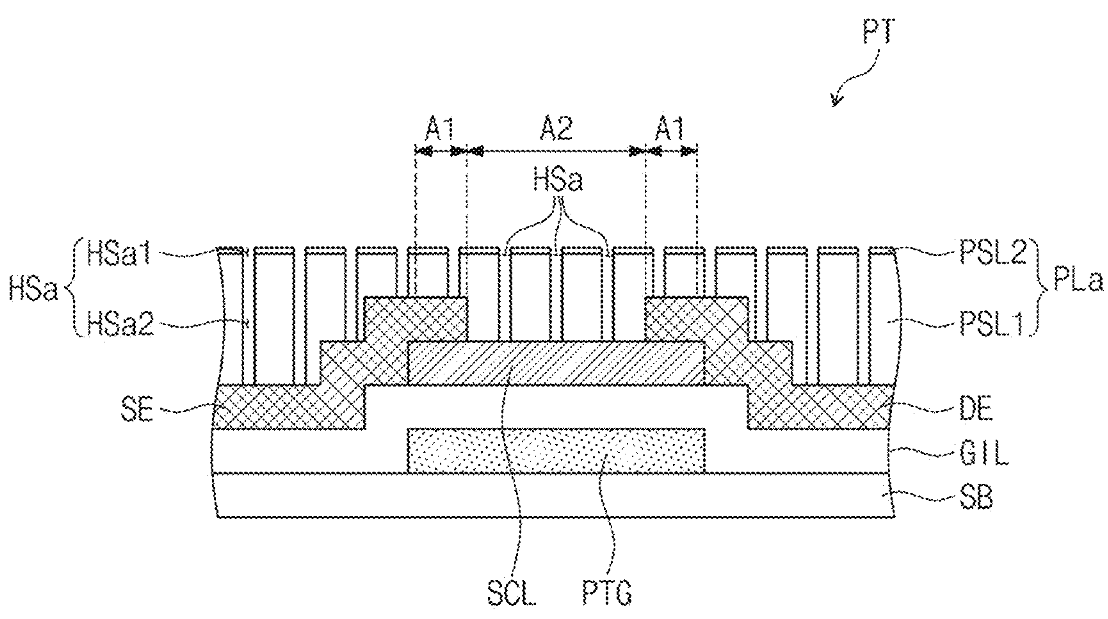
FIG. 2A is a cross-sectional view of a phototransistor according to an alternative embodiment of the disclosure.
Figure 2B:
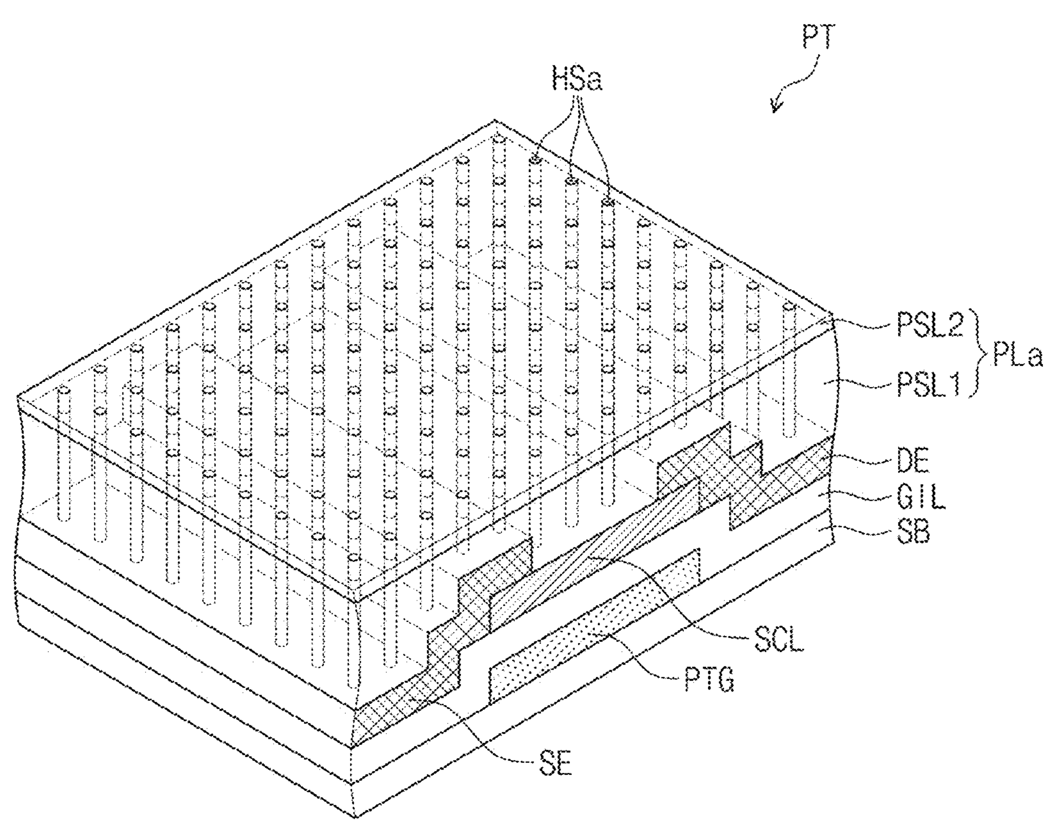
FIG. 2B is a perspective view of the phototransistor of FIG. 2A.

FIG. 2A is a cross-sectional view of a phototransistor PT according to an alternative embodiment of the disclosure, and FIG. 2B is a perspective view of the phototransistor PT of FIG. 2A.

The phototransistor PT shown in FIGS. 2A and 2B is substantially the same as the phototransistor PT shown in FIGS. 1A and 1B except that a porous layer PLa may have a structure including a first sub-porous layer PSL1 and a second sub-porous layer PSL2. Since the structure under the second sub-porous layer PSL2 has the same structure as that of FIGS. 1A and 1B, any repetitive detailed description thereof will be omitted.

Referring to FIGS. 2A and 2B, in an embodiment, the porous layer PLa may include the first sub-porous layer PSL1 and the second sub-porous layer PSL2 each having a porous structure. The first sub-porous layer PSL1 may be disposed on a source electrode SE, a drain electrode DE, and a semiconductor layer SCL. The second sub-porous layer PSL2 may be disposed on the first sub-porous layer PSL1. The porous layer PLa may be provided with a plurality of holes HSa defined through the first sub-porous layer PSL1 and the second sub-porous layer PSL2. The holes HSa may include a plurality of first sub-holes HSa1 defined through the second sub-porous layer PSL2 and a plurality of second sub-holes HSa2 defined through the first sub-porous layer PSL1. The first and second sub-holes HSa1 and HSa2 may be aligned with each other.

Referring to FIG. 2B, the holes HSa may be arranged spaced apart from each other when viewed in the plan view. In an embodiment, for example, the holes HSa may be arranged to be spaced apart from each other at regular intervals when viewed in the plan view, however, they should not be limited thereto or thereby. According to an alternative embodiment, the holes HSa may be arranged at irregular different intervals. According to an embodiment, the holes HSa may have the same size as each other when viewed in the plan view. In an embodiment, for example, the size of the holes HSa may be equal to or greater than about 10 nm and equal to or smaller than about 1000 nm, however, it should not be limited thereto or thereby. According to an embodiment, the holes HSa may have different sizes from each other when viewed in the plan view. According to an embodiment, the holes HSa may be formed completely through the porous layer PLa, however, they should not be limited thereto or thereby. According to an alternative embodiment, the holes HSa may be formed through the first sub-porous layer PSL1 and may be formed partially through the second sub-porous layer PSL2 by recessing a portion of the second sub-porous layer PSL2.

According to an embodiment, the first sub-porous layer PSL1 may be an organic layer including an organic material. The first sub-porous layer PSL1 may have a thickness of about 20 nm.

According to an embodiment, the second sub-porous layer PSL2 may be an inorganic layer including an inorganic material. The second sub-porous layer PSL2 may include at least one selected from aluminum oxide, titanium oxide, silicon oxide, silicon nitride, silicon oxynitride, zirconium oxide, and hafnium oxide. The second sub-porous layer PSL2 may have a single-layer structure of a hafnium oxide layer, however, it should not be limited thereto or thereby. The second sub-porous layer PSL2 may have a single-layer or multi-layer structure and may include at least one selected from the above-mentioned materials, however, it should not be limited thereto or thereby.

Figure 3A:
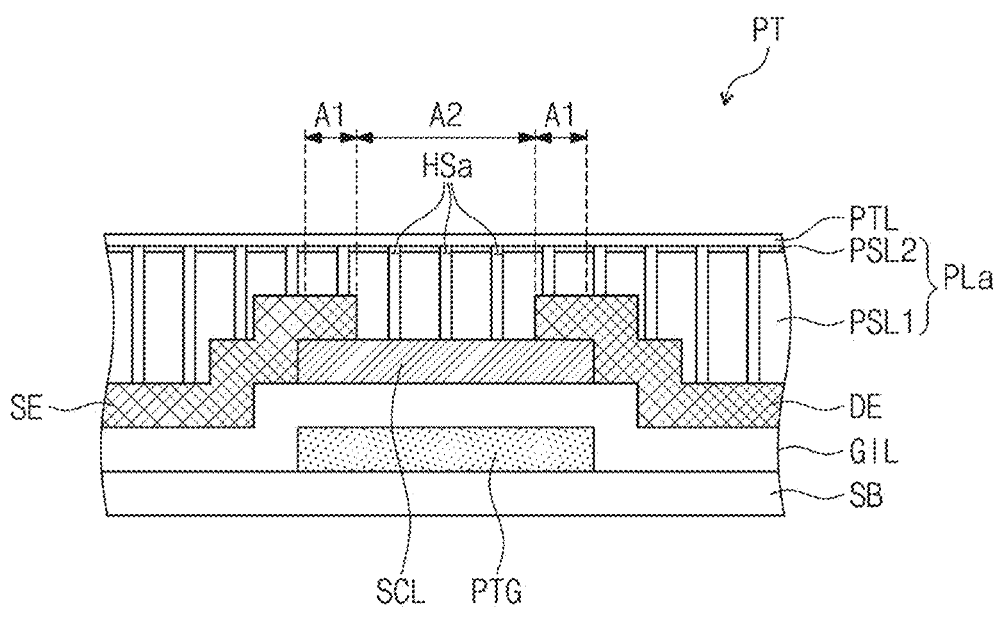
FIG. 3A is a cross-sectional view of a phototransistor according to another alternative embodiment of the disclosure.
Figure 3B:
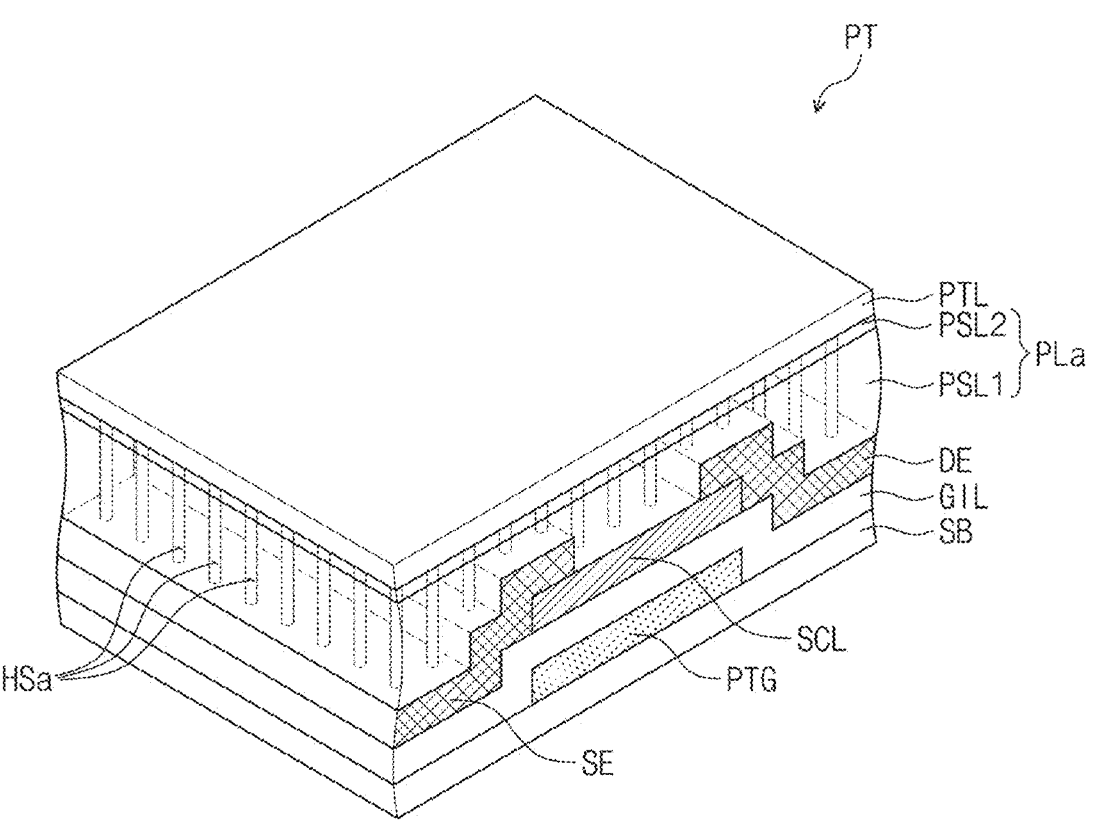
FIG. 3B is a perspective view of the phototransistor of FIG. 3A.

FIG. 3A is a cross-sectional view of a phototransistor PT according to another alternative embodiment of the disclosure, and FIG. 3B is a perspective view of the phototransistor PT of FIG. 3A.

The phototransistor PT shown in FIGS. 3A and 3B is substantially the same as the phototransistor PT shown in FIGS. 2A and 2B except that the phototransistor PT of FIGS. 3A and 3B may further include a protective layer PTL. In FIGS. 3A and 3B, the phototransistor PT has the same structure and function as those of the phototransistor PT of FIGS. 2A and 2B except for the protective layer PTL, and thus, any repetitive detailed descriptions of the same elements as those described above will be omitted.

Referring to FIGS. 3A and 3B, the protective layer PTL may be disposed or formed on a porous layer PLa. A semiconductor layer SCL may be exposed to the outside through a plurality of holes HSa defined through the porous layer PLa. The protective layer PTL may entirely cover the porous layer PLa to protect the semiconductor layer SCL from moisture, oxygen, and a foreign substance such as dust particles.

The protective layer PTL may include an inorganic insulating material or an organic insulating material. The protective layer PTL may have a single-layer structure, however, it should not be limited thereto or thereby. According to an embodiment, the protective layer PTL may have a multi-layer structure. In such an embodiment where the protective layer PTL has the multi-layer structure, the protective layer PTL may have a structure in which an inorganic insulating material and an organic insulating material are stacked. The inorganic insulating material may include silicon oxide ($SiO_x$) or silicon nitride ($SiN_x$), and the organic insulating material may include benzocyclobutene or photoacryl, however, the inorganic insulating material and the organic insulating material should not be particularly limited.

Figure 4A:
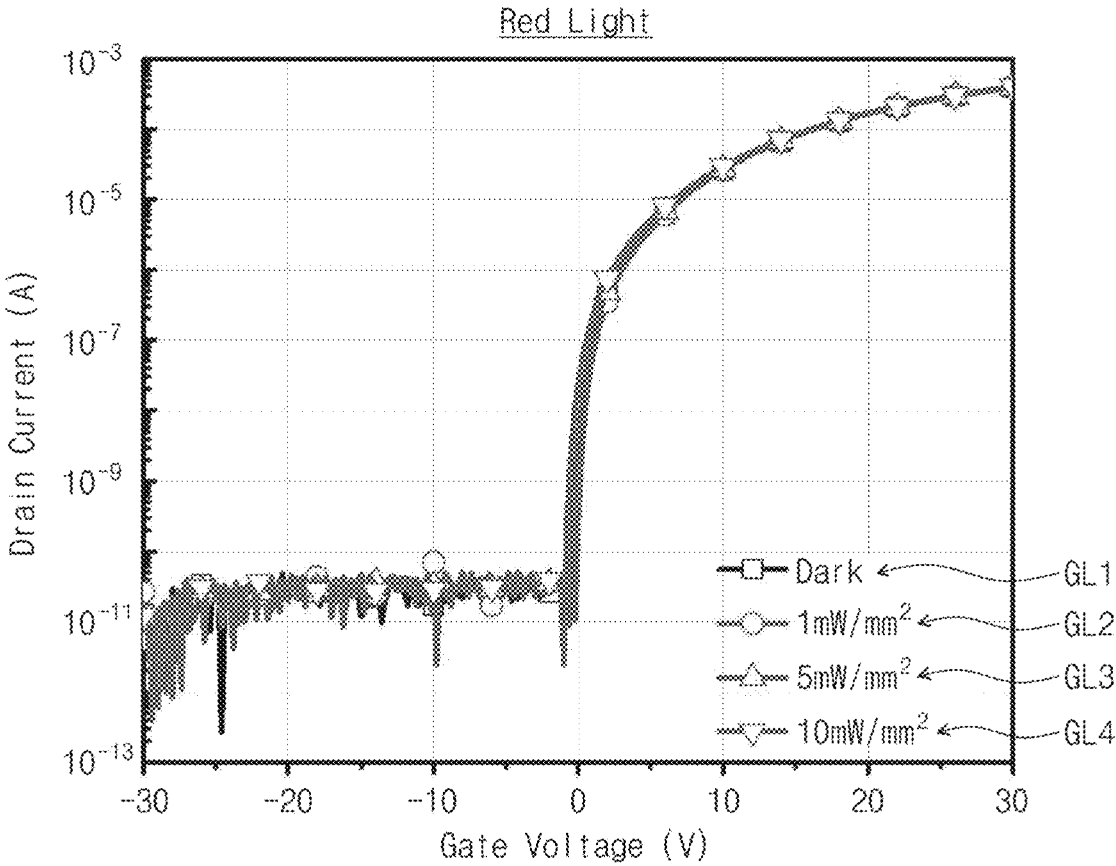
FIG. 4A is a graph showing an optical response of a comparative example of a phototransistor with respect to a red light.
Figure 4B:
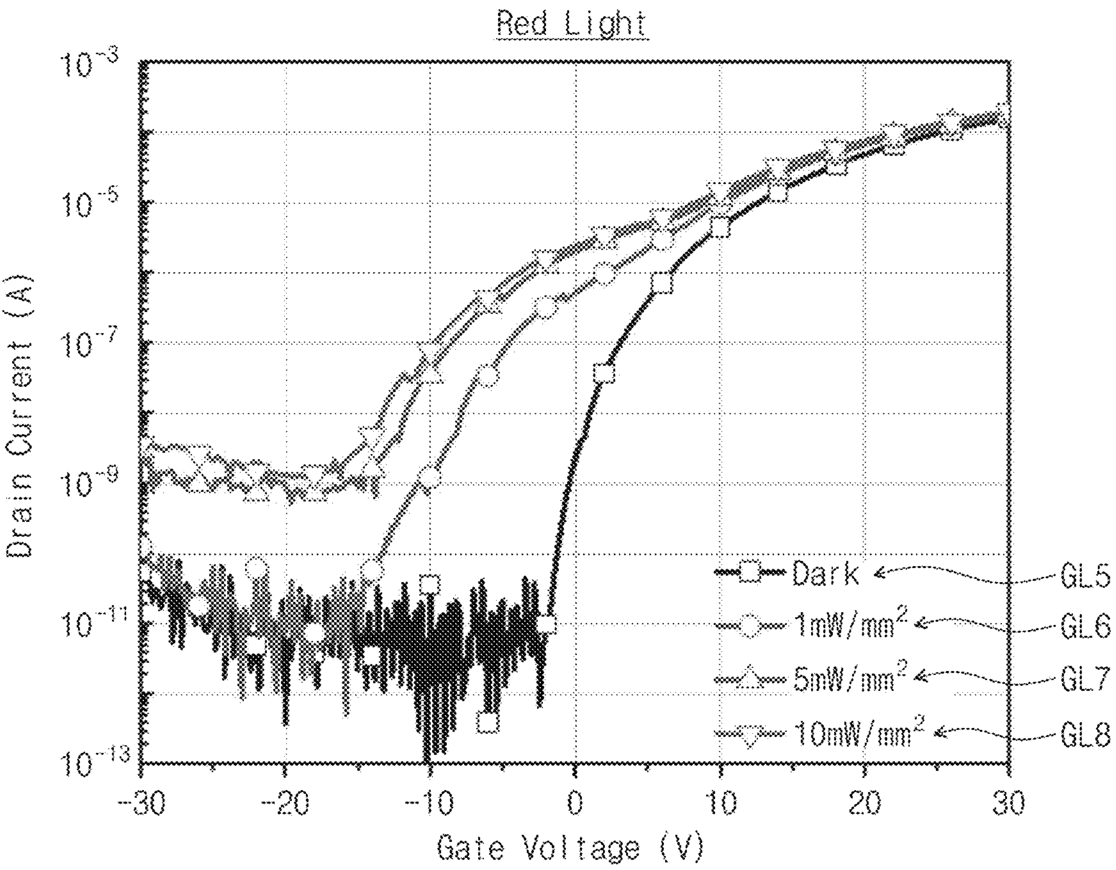
FIG. 4B is a graph showing an optical response of a phototransistor with respect to a red light according to an embodiment of the disclosure.

FIG. 4A is a graph showing an optical response with respect to a red light of a comparative example of a phototransistor (hereinafter, referred to as a comparison phototransistor) that does not include a porous layer, and FIG. 4B is a graph showing an optical response with respect to the red light of an embodiment of the phototransistor PT that includes the porous layer PLa. In FIGS. 4A and 4B, an x-axis represents a gate voltage applied to the comparison phototransistor and the gate electrode PTG (refer to FIG. 2A) of the phototransistor PT, and a y-axis represents a drain current of the comparison phototransistor and the phototransistor PT. Referring to FIG. 4A, a first graph GL1 represents the optical response of the comparison phototransistor in a dark state in which the red light is not provided, and a second graph GL2 represents the optical response of the comparison phototransistor in a case in which the red light is provided at an intensity of about 1 milliwatt per square millimeter ($mW/mm^2$). A third graph GL3 represents the optical response of the comparison phototransistor in a case in which the red light is provided at an intensity of about 5 $mW/mm^2$, and a fourth graph GL4 represents the optical response of the comparison phototransistor in a case in which the red light is provided at an intensity of about 10 $mW/mm^2$. Referring to FIG. 4B, a fifth graph GL5 represents the optical response of the phototransistor PT in the dark state in which the red light is not provided, and a sixth graph GL6 represents the optical response of the phototransistor PT in the case in which the red light is provided at an intensity of about 1 $mW/mm^2$. A seventh graph GL7 represents the optical response of the phototransistor PT in the case in which the red light is provided at an intensity of about 5 $mW/mm^2$, and an eighth graph GL8 represents the optical response of the phototransistor PT in the case in which the red light is provided at an intensity of about 10 $mW/mm^2$.

According to the first, second, third, and fourth graphs GL1, GL2, GL3, and GL4, it is observed that the comparison phototransistor has the same threshold voltage as the threshold voltage in the dark state even though the intensity of red light increases. That is, the threshold voltage of the comparison phototransistor is not changed even though the intensity of the red light increases. However, according to the fifth, sixth, seventh, and eighth graphs GL5, GL6, GL7, and GL8, in an embodiment where the phototransistor PT includes the porous layer PLa, it is observed that the threshold voltage of the phototransistor PT is shifted to a negative direction as the intensity of the red light increases when compared with the threshold voltage of the phototransistor PT in the dark state. As the intensity of the red light increases, it is observed that an off-current of the phototransistor PT increases.

The phototransistor employing the oxide semiconductor may have high stability and high mobility compared with the phototransistor including the amorphous silicon. The phototransistor using the oxide semiconductor has high stability and high mobility, but it does not absorb the light in the visible region and the infrared region due to its wide bandgap. Accordingly, the phototransistor employing the oxide semiconductor has limited use as a photo-sensing device. An embodiment of the phototransistor PT according to the disclosure may include the porous layer PL provided with the holes HS and disposed on the semiconductor layer SCL including the oxide semiconductor, and thus, the light absorption rate in the visible region and the infrared region may be improved. As the external light is collected or internally scattered in the holes HS of the phototransistor PT, the amount of the light incident into the semiconductor layer SCL may increase, and thus, the light absorption rate may be improved. The light absorption rate may be controlled by the size and the number of the holes HS.

Figure 5A:
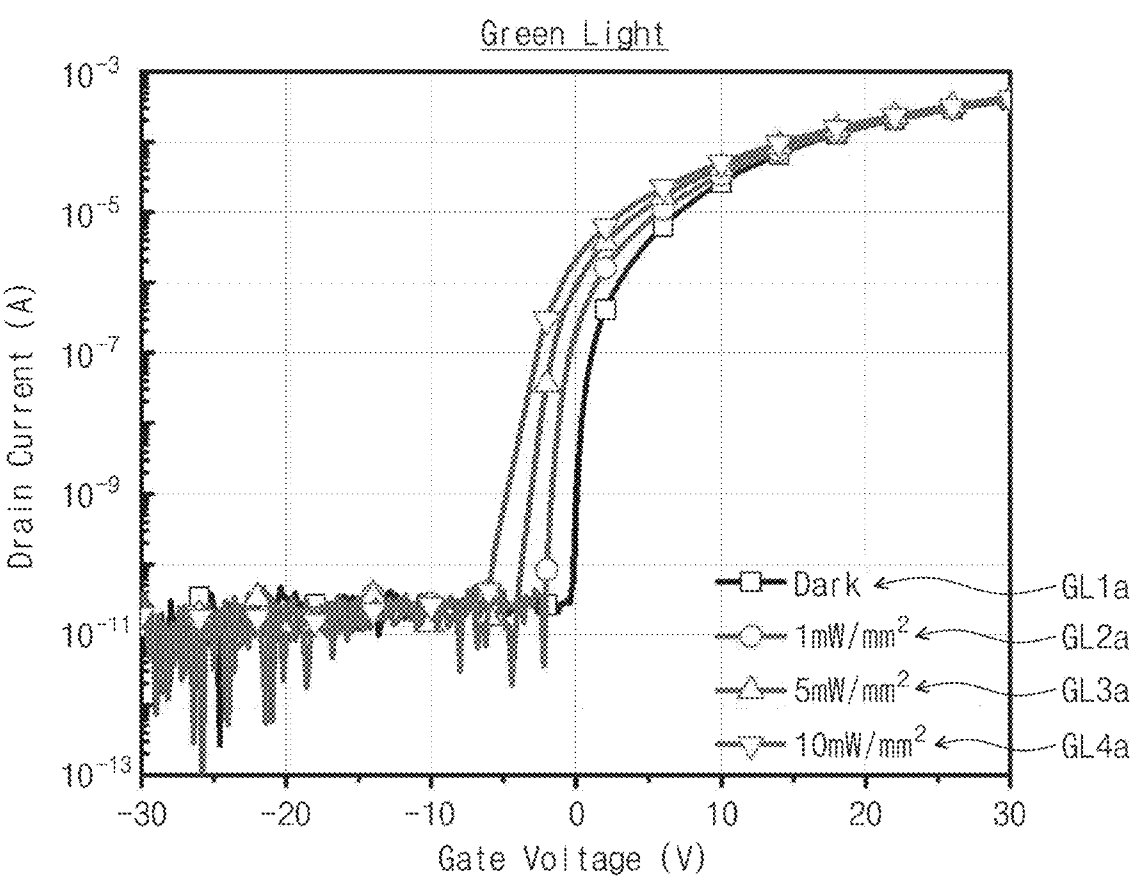
FIG. 5A is a graph showing an optical response of a comparative example of a phototransistor with respect to a green light.
Figure 5B:
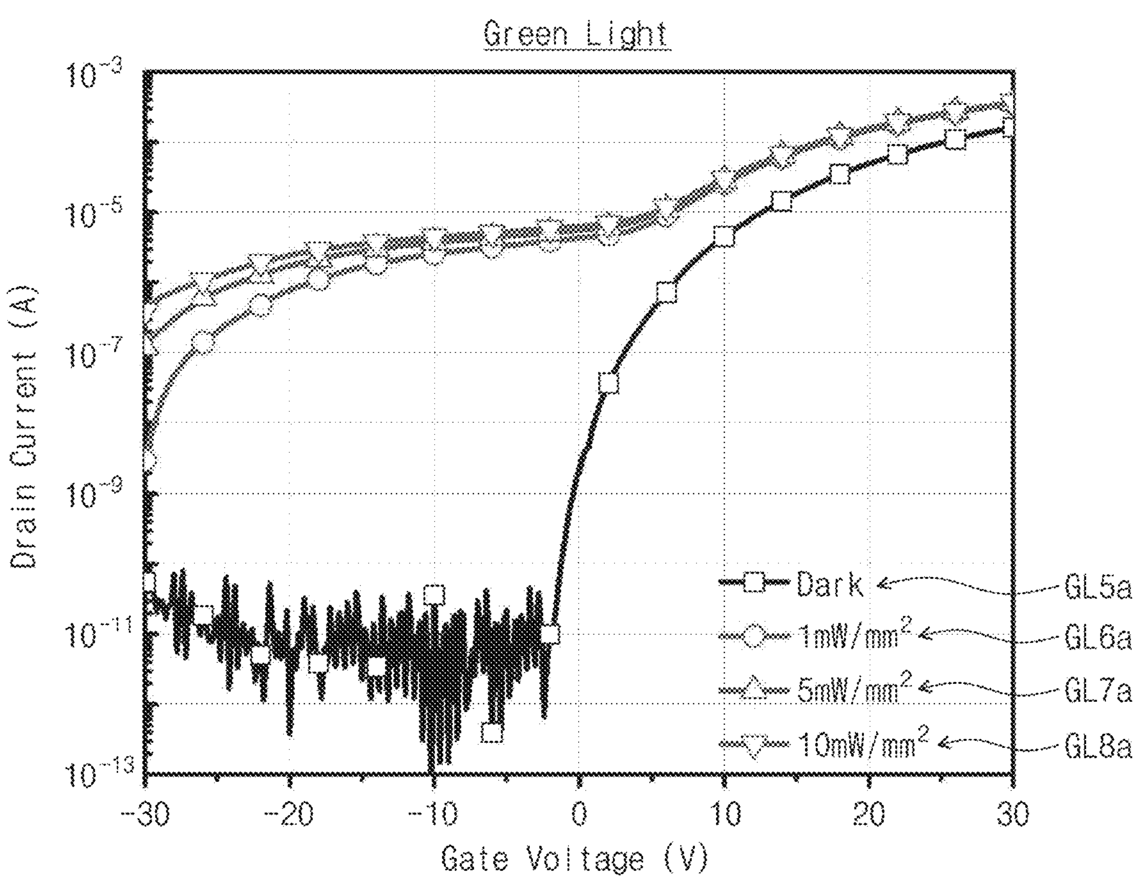
FIG. 5B is a graph showing an optical response of a phototransistor with respect to a green light according to an embodiment of the disclosure.

FIG. 5A is a graph showing an optical response with respect to a green light of the comparison phototransistor, and FIG. 5B is a graph showing an optical response with respect to the green light of the phototransistor PT including the porous layer Pla of FIG. 2A.

In FIGS. 5A and 5B, an x-axis represents a gate voltage applied to the gate electrode PTG (refer to FIG. 2A) of the phototransistor, and a y-axis represents a drain current of the comparison phototransistor and the phototransistor PT. Referring to FIG. 5A, a first graph GL1*a* represents the optical response of the comparison phototransistor in a dark state in which the green light is not provided, and a second graph GL2*a* represents the optical response of the comparison phototransistor in a case where the green light is provided at the intensity of about 1 $mW/mm^2$. A third graph GL3*a* represents the optical response of the comparison phototransistor in a case where the green light is provided at the intensity of about 5 $mW/mm^2$, and a fourth graph GL4*a* represents the optical response of the comparison phototransistor in a case where the green light is provided at the intensity of about 10 $mW/mm^2$. Referring to FIG. 5B, a fifth graph GL5*a* represents the optical response of the phototransistor PT in the dark state in which the green light is not provide, and a sixth graph GL6*a* represents the optical response of the phototransistor PT in the case where the green light is provided at the intensity of about 1 $mW/mm^2$. A seventh graph GL7*a* represents the optical response of the phototransistor PT in the case where the green light is provided at the intensity of about 5 $mW/mm^2$, and an eighth graph GL8*a* represents the optical response of the phototransistor PT in the case where the green light is provided at the intensity of about 10 $mW/mm^2$.

According to the first, second, third, and fourth graphs GL1*a*, GL2*a*, GL3*a*, and GL4*a*, it is observed that the optical response of the comparison phototransistor with respect to the radiation of the light hardly occurs even though the intensity of the green light increases. That is, although the intensity of the green light increases, the threshold voltage of the comparison phototransistor and the off-current of the comparison phototransistor are almost not changed. However, according to the fifth, sixth, seventh, and eighth graphs GL5*a*, GL6*a*, GL7*a*, and GL8*a*, in an embodiment where the phototransistor PT includes the porous layer PLa, it is observed that the threshold voltage of the phototransistor PT is shifted to a negative direction as the intensity of the green light increases when compared with the threshold voltage of the phototransistor PT in the dark state. As the intensity of the green light increases, it is observed that the off-current of the phototransistor PT increases.

Figure 6:
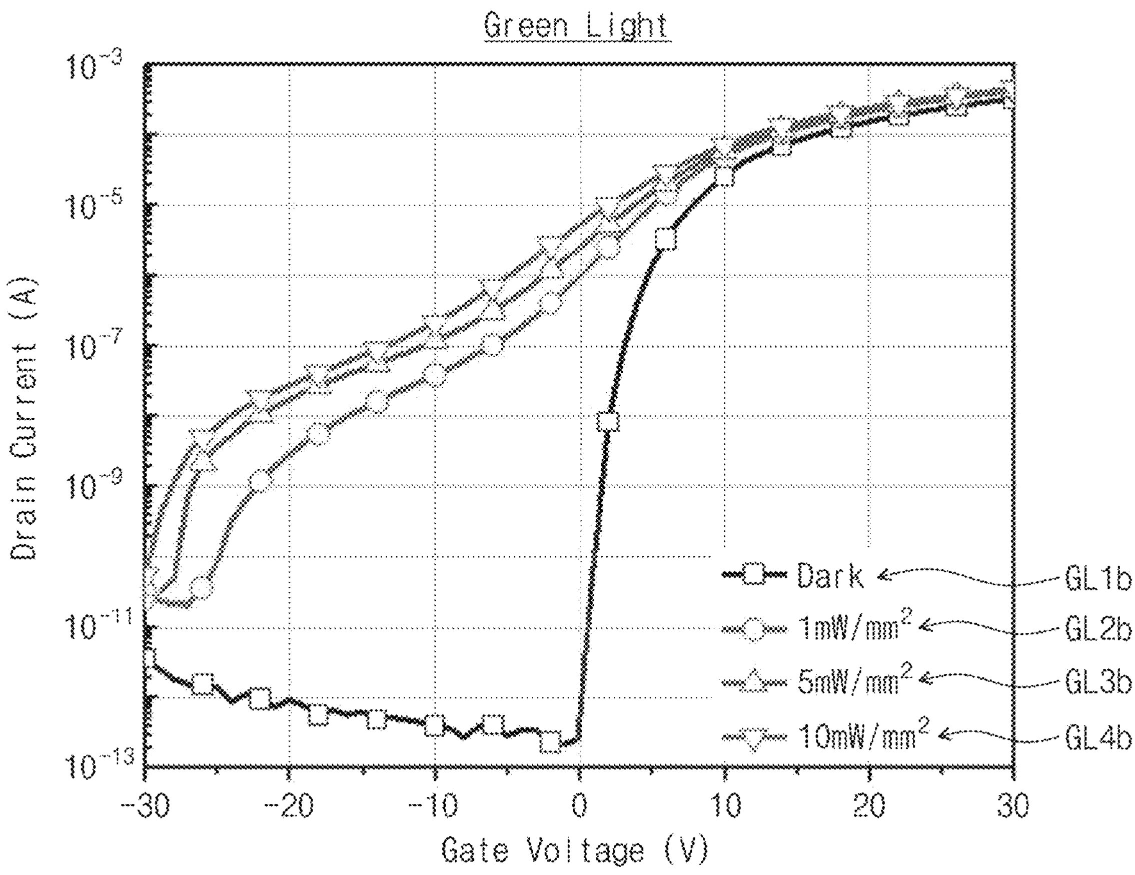
FIG. 6 is a graph showing an optical response of a phototransistor with respect to a green light according to an embodiment of the disclosure.

FIG. 6 is a graph showing an optical response of the phototransistor PT with respect to the green light according to an embodiment of the disclosure. Particularly, graphs shown in FIG. 6 represent the optical response of the phototransistor PT in which the protective layer PTL is formed on the porous layer PLa provided with the holes HSa defined therethrough as shown in FIGS. 3A and 3B. In FIG. 6, an x-axis represents a gate voltage applied to the gate electrode PTG (refer to FIG. 2A) of the phototransistor PT, and a y-axis represents a drain current of the phototransistor PT. Referring to FIG. 6, a first graph GL1*b* represents the optical response of the phototransistor PT in the dark state in which the green light is not provided, and a second graph GL2*b* represents the optical response of the phototransistor PT in the case where the green light is provided at the intensity of about 1 $mW/mm^2$. A third graph GL3*b* represents the optical response of the phototransistor PT in the case where the green light is provided at the intensity of about 5 $mW/mm^2$, and a fourth graph GL4*b* represents the optical response of the phototransistor PT in the case where the green light is provided at the intensity of about 10 $mW/mm^2$.

When compared with a threshold voltage (hereinafter, referred to as a dark threshold voltage of about 0 volt (V)) in the dark state, the threshold voltage of the phototransistor PT is shifted to a negative direction by about 25 V when the green light has the intensity of about 1 $mW/mm^2$ (hereinafter, referred to as a first green light). When the first green light is provided, a drain current of the first green light measured at the dark threshold voltage is about $10^7$ times larger than a drain current in the dark state measured at the dark threshold voltage. When the intensity of the green light is about 5 $mW/mm^2$ (hereinafter, referred to as a second green light), the threshold voltage of the phototransistor PT is shifted to the negative direction by about 28V. When the second green light is provided, a drain current of the second green light measured at the dark threshold voltage is about $10^8$ times larger than the drain current in the dark state measured at the dark threshold voltage. When the green light has the intensity of about 10 $mW/mm^2$ (hereinafter, referred to as a third green light), the threshold voltage is shifted to the negative direction by about 30 V.

When the third green light is provided, a drain current of the third green light measured at the dark threshold voltage is about $10^8$ times larger than the drain current in the dark state measured at the dark threshold voltage.

According to an embodiment, as the porous layer PLa is provided with the plurality of holes HSa, the amount of external light provided to the semiconductor layer SCL may increase by collecting or internally scattering the external light provided to the phototransistor PT. In such an embodiment, the light absorption rate of the phototransistor PT may be controlled by adjusting the size and the number of the holes HSa defined through the porous layer PLa. In such an embodiment, as the porous layer PLa is provided with the holes HSa defined through the first sub-porous layer PSL1 and the second sub-porous layer PSL2, the semiconductor layer SCL may be exposed to the outside. The protective layer PTL may entirely cover the porous layer PLa to protect the semiconductor layer SCL from moisture, oxygen, or a foreign substance such as dust particles. Accordingly, when compared with a case having a structure in which the semiconductor layer SCL is directly exposed to the outside, the light absorption rate of the semiconductor layer SCL with respect to the external light may be lowered since the absorption of the porous layer PLa with respect to the external light is disrupted by the protective layer PTL.

As described above, the graph of FIG. 6, which represents the optical response with respect to the green light of the phototransistor PT including the protective layer PTL, shows a relatively low light absorption characteristics when compared with the graph of FIG. 5B, which represents the optical response with respect to the green light of the phototransistor PT including the porous layer PLa. However, when compared with the graph of FIG. 5A, which represents the optical response with respect to the green light of the comparison phototransistor, the graph of FIG. 6 shows the light absorption characteristics that is still significant.

Figure 7:
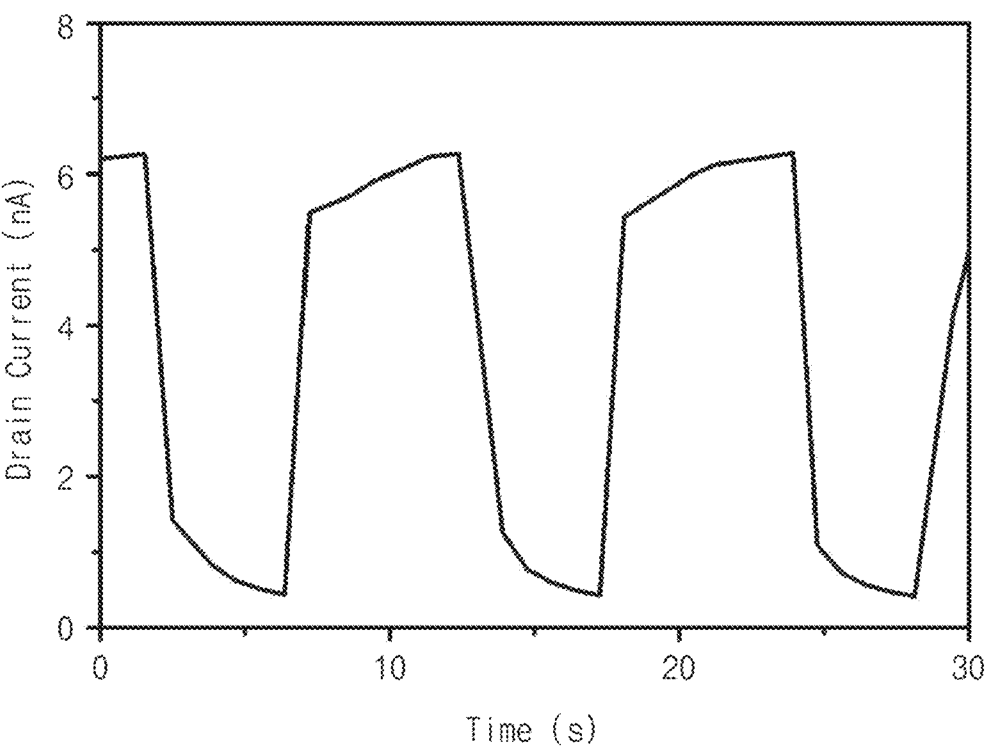
FIG. 7 is a graph showing a persistent photocurrent phenomenon when a green light is radiated to a phototransistor according to an embodiment of the disclosure.

FIG. 7 is a graph showing a persistent photocurrent phenomenon when the green light is radiated to the phototransistor PT according to an embodiment of the disclosure.

In detail, the graph of FIG. 7 represents a drain current as a function of time when the green light with a wavelength of about 565 nm, a frequency of about 0.1 hertz (Hz), and an intensity of about 10 $mW/mm^2$ is provided for about 2500 seconds on the conditions that a voltage of about −4 V is applied to the gate electrode PTG (refer to FIG. 2A) of the phototransistor PT (refer to FIG. 2A) and a voltage of about 10.1 V is applied to the drain electrode DE (refer to FIG. 2A) of the phototransistor PT (refer to FIG. 2A).

In the disclosure, a high persistent photocurrent (PPC) means that a difference between a current value in a state in which a light is applied and a current value in a state in which the application of the light is stopped is small, and a low persistent photocurrent (PPC) means that the difference between the current value in the state in which the light is applied and the current value in the state in which the light application is stopped is large.

Referring to FIG. 7, when the frequency of the light is about 0.1 Hz, a waveform of the drain current has a period of about 10 seconds. As represented by the graph, a minimum drain current (a minimum drain current when the light is not provided) is about 0.5 nanoampere (nA), and a maximum drain current (a maximum drain current when the light is provided) is about 6.3 nA. When the green light is applied, the time spent to increase the drain current from the minimum drain current to about 90% of the maximum drain current may be about 1.92 seconds, and when the application of the green light is stopped, the time spent to decrease the drain current from the maximum drain current to about 10% of the maximum drain current may be about 2.01 seconds. The above period may be continuous for about 2500 seconds, and values of the maximum drain current and the minimum drain current may be kept constant while the period is continuous.

In general, the oxide phototransistor has high persistent photocurrent. In a case where the above process is repeated in the oxide phototransistor with the high persistent photocurrent, the values of the maximum drain current and the minimum drain current may not be constant due to remaining holes. However, the phototransistor PT including the porous layers PLa (refer to FIG. 2A) may have improved durability than a conventional oxide phototransistor that does not include the porous layers PLa (That is, the values of the maximum drain current and the minimum drain current may be constantly maintained). Accordingly, reliability in operation of the phototransistor PT may be improved.

Figure 8:
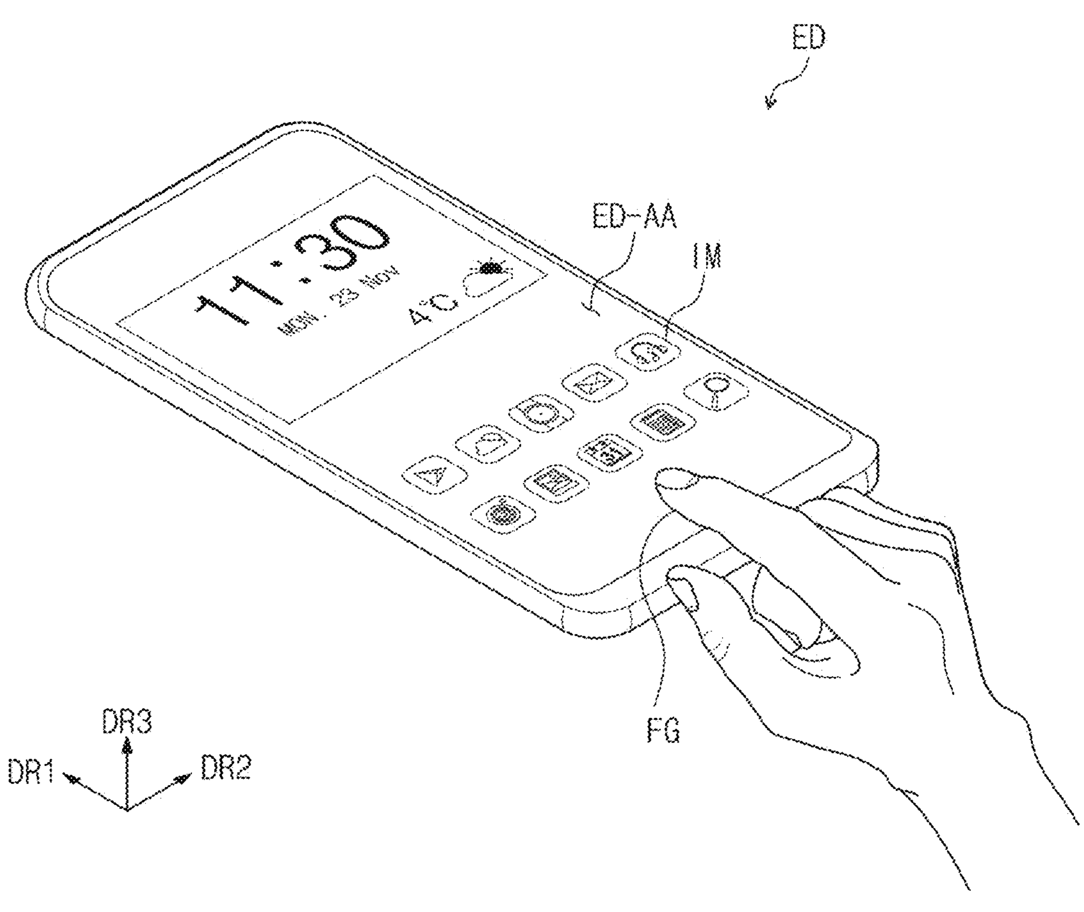
FIG. 8 is a perspective view of an electronic device according to an embodiment of the disclosure.
Figure 9:
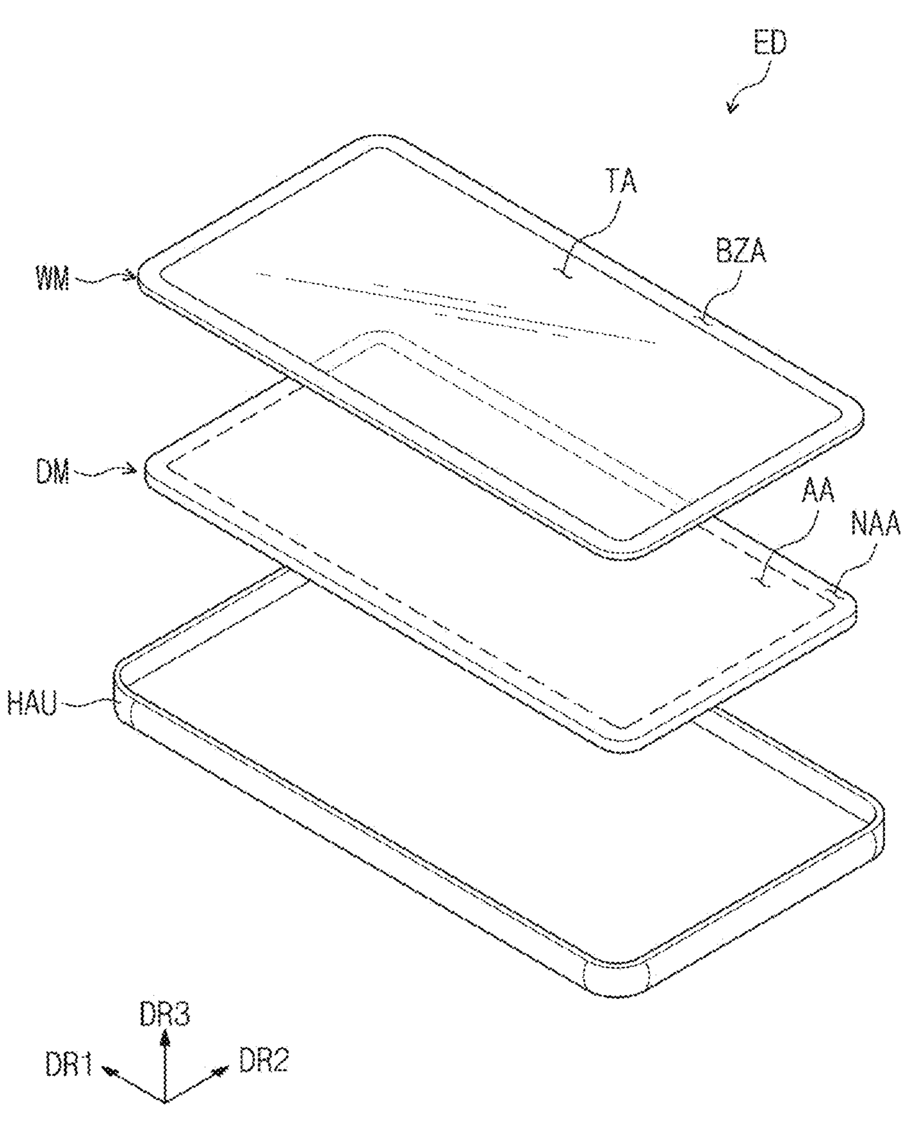
FIG. 9 is an exploded perspective view of an electronic device according to an embodiment of the disclosure.
Figure 10:
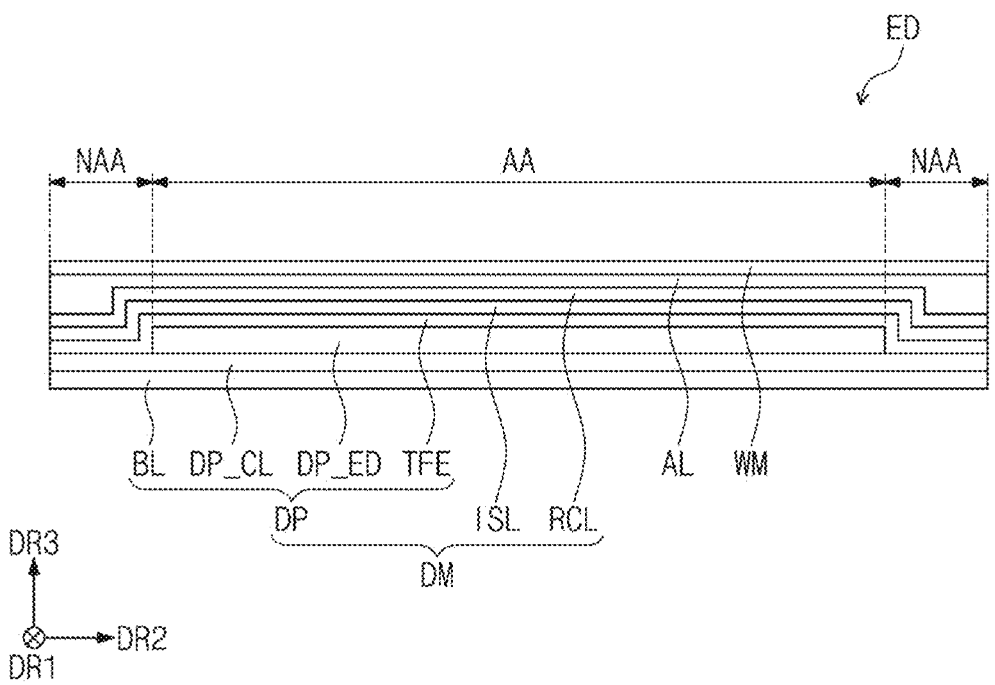
FIG. 10 is a cross-sectional view of an electronic device according to an embodiment of the disclosure.

FIG. 8 is a perspective view of an electronic device ED according to an embodiment of the disclosure. FIG. 9 is an exploded perspective view of the electronic device ED according to an embodiment of the disclosure. FIG. 10 is a cross-sectional view of the electronic device ED according to an embodiment of the disclosure.

An embodiment of the electronic device ED may be a device that is activated in response to electrical signals to display an image. Such an embodiment of the electronic device ED may be applied to a large-sized electronic item, such as a television set or an outdoor billboard, and a small and medium-sized electronic item, such as a monitor, a mobile phone, a tablet computer, a navigation unit, or a game unit, for example. However, these are merely examples, and the electronic device ED may be applied to other electronic items as long as they do not depart from the invention of the disclosure. FIG. 8 shows an embodiment where the electronic device ED is a mobile phone.

Referring to FIG. 8, the electronic device ED may have a rectangular shape with long sides in a first direction DR1 and short sides in a second direction DR2 crossing the first direction DR1. However, the shape of the electronic device ED should not be limited to the rectangular shape, and the electronic device ED may have a variety of shapes, such as a circular shape, a polygonal shape, etc.

According to an embodiment, the electronic device ED may be flexible. The term "flexible" used herein refers to the property of being able to be bent, and the flexible electronic device may include all structures from a structure that is completely bent to a structure that is bent at the scale of a few nanometers. In an embodiment, for example, the flexible electronic device ED may be a curved device or a foldable device. According to an embodiment, the electronic device ED may be rigid.

The electronic device ED may display an image IM through a display area ED-AA. The display area ED-AA of the electronic device ED may be substantially parallel to a surface defined by a first direction DR1 and a second direction DR2. The electronic device ED may display the image IM through the display area ED-AA toward a third direction DR3 substantially perpendicular to a plane defined by the first direction DR1 and the second direction DR2. Here, the third direction DR3 may be a thickness direction of the electronic device ED. FIG. 8 shows an embodiment having a flat display area ED-AA, however, according to an alternative embodiment, the display area ED-AA of the electronic device ED may have a curved shape bent from at least one side of the plane.

Front (or upper) and rear (or lower) surfaces of each member of the electronic device ED may be opposite to each other in the third direction DR3, and a normal line direction of each of the front and rear surfaces may be substantially parallel to the third direction DR3. A separation distance between the front and rear surfaces of each member (or each unit) in the third direction DR3 may correspond to a thickness in the member (or the unit) in the third direction DR3.

In the disclosure, the expression "when viewed in a plan view" may mean a state of being viewed in the third direction DR3. In the disclosure, the expression "on a cross-section" may mean a state of being viewed in the first direction DR1 or the second direction DR2. Here, directions indicated by the first, second, and third directions DR1, DR2, and DR3 may be relative to each other, and thus, the directions indicated by the first, second, and third directions DR1, DR2, and DR3 may be changed to other directions.

According to an embodiment, the image IM provided from the electronic device ED may include a still image as well as a video. FIG. 8 shows an embodiment where the image IM is a clock widget and application icons as. A surface through which the image IM is displayed may correspond to a front surface of the electronic device ED and a front surface of a window WM.

According to an embodiment, the electronic device ED may sense an external input applied thereto from the outside. The external input may include a variety of external inputs provided from the outside. In an embodiment, for example, the external input may include force, pressure, temperature, light, etc. The external input may include an external input (e.g., a hovering input) applied when in proximity to or approaching close to the electronic device ED at a predetermined distance as well as a touch input, e.g., a hand of a user or a pen.

According to an embodiment, the electronic device ED may sense the user input through the display area ED-AA defined in the front surface thereof and may respond the sensed input. However, the area of the electronic device ED in which the external input is sensed should not be limited to the front surface of the electronic device ED. The electronic device ED may sense the user input applied to a side or rear surface of the electronic device ED depending on its design, and it should not be limited to a specific embodiment.

According to an embodiment, the electronic device ED may sense biometric information, such as a user's fingerprint FG, applied thereto from the outside. The display area ED-AA of the electronic device ED may include a fingerprint recognition area. The fingerprint recognition area may be defined over the entire display area ED-AA or may be defined in a portion of the display area ED-AA.

Referring to FIG. 9, an embodiment of the electronic device ED may include the window WM, a display module DM, and a housing HAU. The window WM may be coupled with the housing HAU to form an external appearance of the electronic device ED and may provide an inner space to accommodate components of the electronic device ED.

The window WM may be disposed on the display module DM. The window WM may have a shape corresponding to a shape of the display module DM. The window WM may cover an entire external surface of the display module DM and may protect the display module DM from external impacts and scratches.

The window WM may include an optically transparent insulating material. In an embodiment, for example, the window WM may include a glass substrate or a polymer substrate, and the window WM may include a tempered glass substrate. The window WM may have a single-layer or multi-layer structure. The window WM may further include functional layers, such as an anti-fingerprint layer, a phase control layer, a hard coating layer, etc., disposed on an optically transparent substrate.

The front surface of the window WM may correspond to a display surface of the electronic device ED. The front surface of the window WM may include a transmission area TA and a bezel area BZA.

The transmission area TA of the window WM may be an optically transparent area. The window WM may transmit the image IM provided from the display module DM through the transmission area TA, and the user may view the image IM. The transmission area TA of the window WM may correspond to the display area ED-AA of the electronic device ED.

The bezel area BZA of the window WM may be obtained by printing a material having a predetermined color on an area of the window WM. The bezel area BZA of the window WM may prevent components of the display module DM, which are disposed to overlap the bezel area BZA, from being viewed from the outside.

The bezel area BZA may be defined adjacent to the transmission area TA, and the shape of the transmission area TA may be defined by the bezel area BZA. In an embodiment, for example, the bezel area BZA may be disposed outside the transmission area TA and may surround the transmission area TA, however, it should not be limited thereto or thereby. Alternatively, the bezel area BZA may be defined to be adjacent to only one side of the transmission area TA or may be omitted. In an embodiment, the bezel area BZA may be defined at a side surface of the electronic device ED rather than the front surface of the electronic device ED.

The display module DM may be disposed between the window WM and the housing HAU. The display module DM may display the image in response to electrical signals and may transmit/receive information about the external input. The display module DM may include an active area AA and a peripheral area NAA.

The active area AA may be activated in response to electrical signals. The images may be displayed through the active area AA, and the external input may be sensed in the active area AA. According to an embodiment, the active area AA of the display module DM may correspond to the above-described transmission area TA. In the disclosure, the expression "an area/portion corresponds to another area/portion" may mean that "an area/portion overlaps another area/portion", and the expression should not be limited to describing a case that "an area/portion has the same size and/or the same shape as those of another area/portion".

The peripheral area NAA may be defined adjacent to the active area AA. In an embodiment, for example, the peripheral area NAA may surround the active area AA, however, it should not be limited thereto or thereby. According to an embodiment, the peripheral area NAA may be defined in a variety of shapes. A driving circuit or a driving line to drive the active area AA, various signal lines to provide electrical signals, and pads may be disposed in the peripheral area NAA. The peripheral area NAA of the display module DM may correspond to the bezel area BZA. Components of the display module DM, which are disposed in the peripheral area NAA, may be prevented from being viewed from the outside by the bezel area BZA.

The housing HAU may be disposed under the display module DM and may accommodate the display module DM. The housing HAU may absorb impacts applied thereto from the outside and may prevent a foreign substance and moisture from entering the display module DM, and thus, the display module DM may be protected by the housing HAU. According to an embodiment, the housing HAU may be provided in a form obtained by coupling a plurality of accommodating members.

The electronic device ED may further include an electronic module including a variety of functional modules to drive the display module DM, a power supply module supplying a power used for an overall operation of the electronic device ED, and a bracket coupled to the display module DM and/or the housing HAU to divide an inner space of the electronic device ED.

Referring to FIG. 10, the display module DM may include a display panel DP, an input sensing layer ISL, and a reflection control layer RCL. The display panel DP may include a base layer BL, a circuit layer DP_CL, a display element layer DP_ED, and an encapsulation layer TFE.

The display panel DP according to an embodiment may be a light-emitting type display panel, however, it should not be particularly limited. In an embodiment, for example, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, embodiments where the display panel DP is the organic light emitting display panel will be described in detail for convenience of description.

The base layer BL may provide a base surface on which the circuit layer DP_CL is disposed. The base layer BL may be a glass substrate, a metal substrate, a polymer substrate, or an organic/inorganic composite material substrate.

The circuit layer DP_CL may be disposed on the base layer BL. The circuit layer DP_CL may include at least one insulating layer, a circuit element, signal lines, and signal pads. The circuit layer DP_CL may include a pixel driving circuit included in each of pixels to display images and a sensor driving circuit included in each of sensors to sense external information. In an embodiment, for example, the sensor may be an optical sensor that senses biometric information using an optical method.

The display element layer DP_ED may be disposed on the circuit layer DP_CL. The display element layer DP_ED may include light emitting elements disposed to overlap the active area AA. The light emitting elements of the display element layer DP_ED may be connected to the circuit element of the circuit layer DP_CL to form the pixel. Each of the pixels may emit a light in response to a driving signal through the active area AA.

The encapsulation layer TFE may be disposed on the display element layer DP_ED and may encapsulate the display element layer DP_ED. The encapsulation layer TFE may include a plurality of thin layers. The thin layers of the encapsulation layer TFE may be provided to improve an optical efficiency of elements of the display element layer DP_ED or to protect the elements.

The input sensing layer ISL may be disposed on the display panel DP The input sensing layer ISL may be disposed directly on the display panel DP. In the disclosure, a structure in which one layer, component, member, or the like is formed on another layer, component, member, or the like through successive processes without using a separate adhesive layer or adhesive member will be referred to as "directly disposed". The expression "the input sensing layer ISL is disposed directly on the display panel DP" means that the input sensing layer ISP is formed on a base surface of the display panel DP through successive processes without employing a separate adhesive layer after the display panel DP is formed.

According to an embodiment, the input sensing layer ISL may be coupled with the display panel DP by an adhesive layer. The input sensing layer ISL may be fixed to an upper surface of the display panel DP by the adhesive layer after being formed through a separate process from the display panel DP.

The input sensing layer ISL may sense the external input applied thereto from the outside and may obtain coordinate information of the external input. The input sensing layer ISL may be driven in various ways, such as a capacitive method, a resistive method, an infrared ray method, a sonic method, or a pressure method, or the like, and it should not be particularly limited. In an embodiment, for example, the input sensing layer ISL may be driven in the capacitive method and may include a plurality of sensing electrodes to sense the external input. The input sensing layer ISL may provide an input signal corresponding to the external input to the display panel DP, and the display panel DP may generate an image corresponding to the input signal.

The reflection control layer RCL may be disposed on the input sensing layer ISL. In an embodiment, the reflection control layer RCL may be disposed directly on the input sensing layer ISL. In such an embodiment, the reflection control layer RCL may be formed by coating or printing a composition of the reflection control layer RCL on a base surface provided by the input sensing layer ISL. The reflection control layer RCL may reduce a reflectance with respect to the external light from the outside.

The electronic device ED may further include an adhesive layer AL disposed between the display module DM and the window WM. The display module DM and the window WM may be coupled to each other with the adhesive layer AL interposed therebetween. The adhesive layer AL may include a transparent adhesive, such as an optically clear adhesive (OCA) film, an optically clear resin (OCR), or a pressure sensitive adhesive (PSA) film. However, the adhesive included in the adhesive layer AL should not be limited thereto or thereby.

Figure 11A:
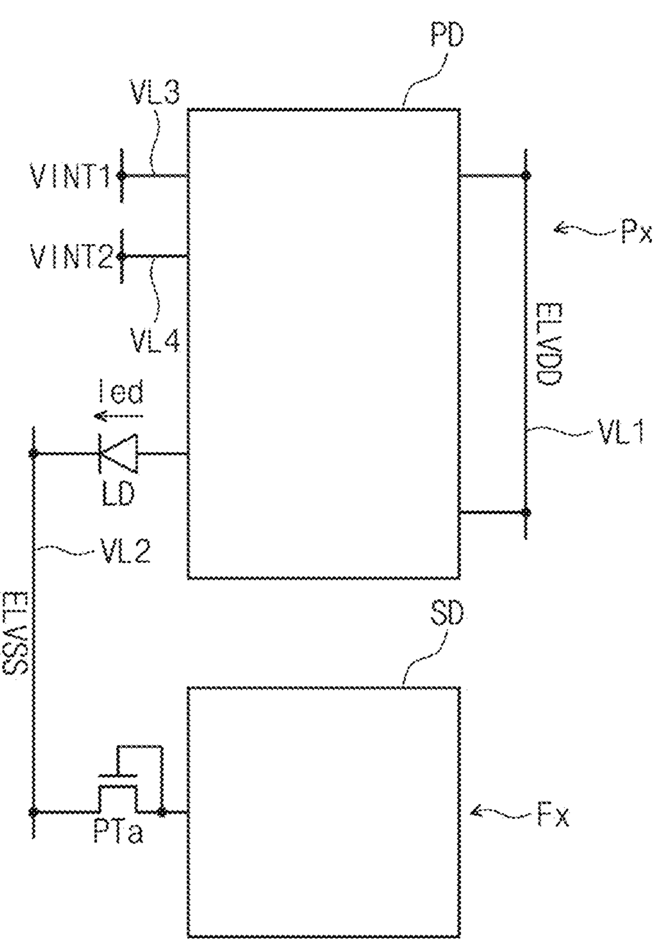
FIG. 11A is a circuit diagram of a pixel and a sensor of a display panel according to an embodiment of the disclosure.
Figure 11B:
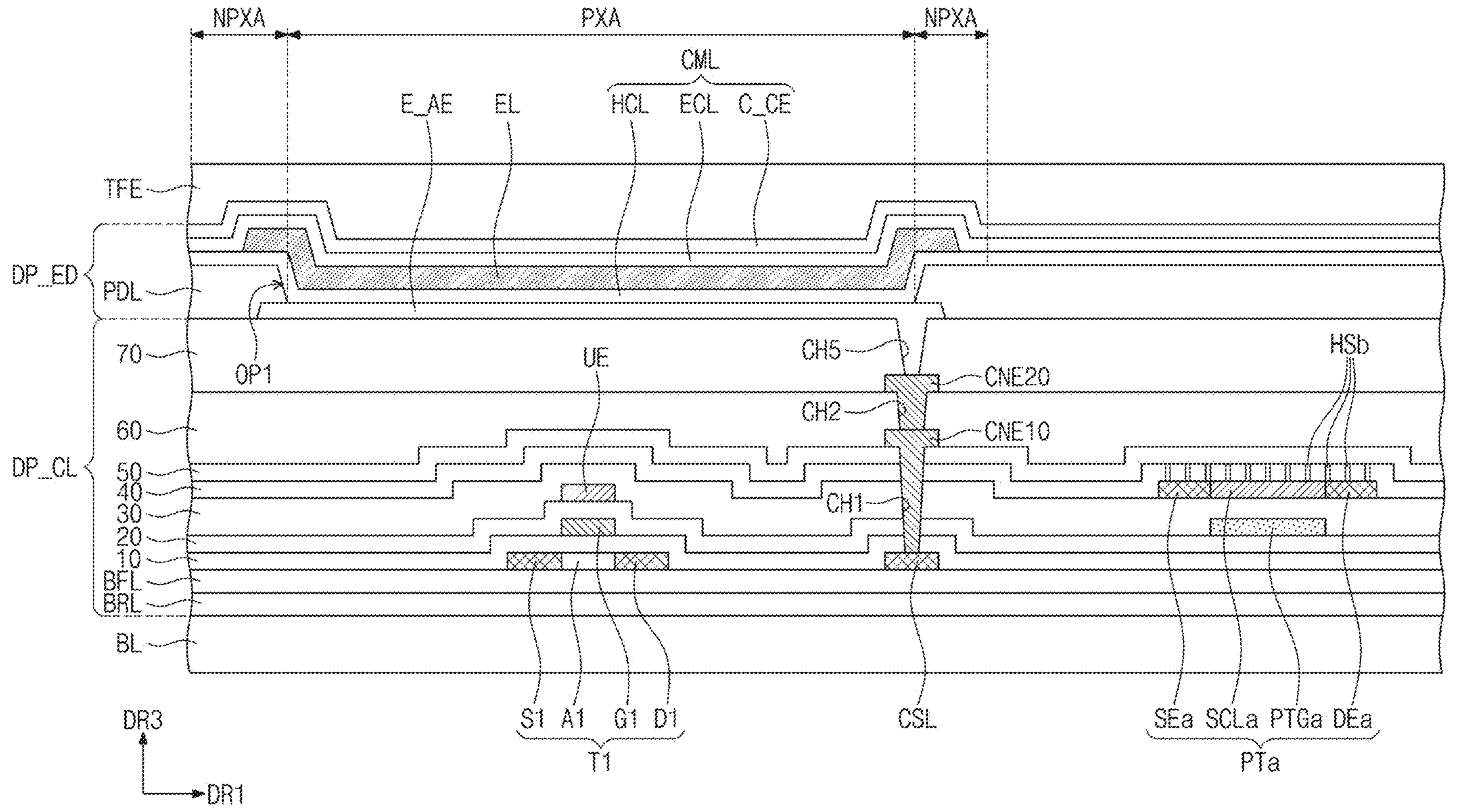
FIG. 11B is a cross-sectional view of a display panel according to an embodiment of the disclosure.

FIG. 11A is a circuit diagram of a pixel Px and a sensor Fx of the display panel according to an embodiment of the disclosure, and FIG. 11B is a cross-sectional view of the display panel according to an embodiment of the disclosure.

Referring to FIGS. 11A and 11B, an embodiment of the pixel Px may include a light emitting element LD and a pixel driving circuit PD. The light emitting element LD may be a light emitting diode. In an embodiment, for example, the light emitting element LD may be an organic light emitting diode including an organic light emitting layer. The pixel driving circuit PD may be connected to the light emitting element LD to control a driving current led provided to the light emitting element LD. In an embodiment, for example, the pixel driving circuit PD may be connected to a first driving voltage line VL1. The first driving voltage line VL1 may apply a first driving voltage ELVDD to the pixel driving circuit PD. In addition, the pixel driving circuit PD may be further connected to first and second initialization voltage lines VL3 and VL4. The first and second initialization voltage lines VL3 and VL4 may respectively apply a first initialization voltage VINT1 and a second initialization voltage VINT2 to the pixel driving circuit PD. An anode electrode of the light emitting element LD may be connected to the pixel driving circuit PD, and a cathode electrode may be connected to a second driving voltage line VL2 applying a second driving voltage ELVSS. The second driving voltage ELVSS may have a voltage level lower than a voltage level of the first driving voltage ELVDD.

The sensor Fx may include a phototransistor PTa with light sensing function and a sensor driving circuit SD connected to the phototransistor PTa. The phototransistor PTa may be an oxide phototransistor including oxide as its photoelectric conversion layer. A gate electrode PTGa and a drain electrode DEa of the phototransistor PTa may be connected to a sensing node connected to the sensor driving circuit SD, and a source electrode SEa of the phototransistor PTa may be connected to the second driving voltage line VL2 for applying the second driving voltage ELVSS. Although not shown in figures, configurations of the sensor driving circuit SD may be variously changed or modified.

Referring to FIG. 11B, the display panel DP may include a base layer BL, a circuit layer DP_CL, a display element layer DP_ED, and an encapsulation layer TFE. The circuit layer DP_CL, the display element layer DP_ED, and the encapsulation layer TFE may be disposed on the base layer BL.

The base layer BL may include a synthetic resin layer. The synthetic resin layer may include a heat-curable resin. The synthetic resin layer may include a polyimide-based resin, however, a material for the synthetic resin layer should not be particularly limited. The synthetic resin layer may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. According to an embodiment, the base layer BL may include a glass substrate, a metal substrate, or an organic/inorganic composite material substrate.

At least one inorganic layer may be disposed on an upper surface of the base layer BL. The inorganic layer may include at least one selected from aluminum oxide, titanium oxide, silicon oxide, silicon oxynitride, zirconium oxide, and hafnium oxide. The inorganic layer may be formed in multiple layers. The inorganic layers may form a barrier layer BRL and/or a buffer layer BFL. According to an embodiment, the buffer layer BFL and the barrier layer BRL may be selectively disposed on the base layer BL.

The circuit layer DP_CL may include the barrier layer BRL and/or the buffer layer BFL. The barrier layer BRL may prevent a foreign substance from entering. The barrier layer BRL may include a silicon oxide layer and a silicon nitride layer. According to an embodiment, each of the silicon oxide layer and the silicon nitride layer may be provided in plural, and the silicon oxide layers may be alternately stacked with the silicon nitride layers.

The buffer layer BFL may be disposed on the barrier layer BRL. The buffer layer BFL may increase an adhesion between the base layer BL and a semiconductor pattern or between the base layer BL and a conductive pattern. According to an embodiment, the buffer layer BFL may include a silicon oxide layer and a silicon nitride layer. The silicon oxide layer and the silicon nitride layer may be alternately stacked one on another.

The semiconductor pattern may be disposed on the buffer layer BFL. Hereinafter, the semiconductor pattern disposed directly on the buffer layer BFL is referred to as a first semiconductor pattern. The first semiconductor pattern may include a silicon semiconductor. In an embodiment, the first semiconductor pattern may include polysilicon, however, it should not be limited thereto or thereby. According to an alternative embodiment, the first semiconductor pattern may include amorphous silicon.

FIG. 11B shows only a portion of the first semiconductor pattern, and the first semiconductor pattern may be further disposed in other areas of the pixel Px (refer to FIG. 11A). The first semiconductor pattern may have different electrical properties depending on whether it is doped or not or whether it is doped with an N-type dopant or a P-type dopant. The first semiconductor pattern may include a doped region and a non-doped region. The doped region may be doped with the N-type dopant or the P-type dopant. A P-type transistor may include a doped region doped with the P-type dopant, and an N-type transistor may include a doped region doped with the N-type dopant.

The doped region may have a conductivity greater than that of the non-doped region and may substantially serve as an electrode or a signal line. The non-doped region may substantially correspond to an active (or a channel) of the transistor. In other words, a portion of the first semiconductor pattern may be the active of the transistor, another portion of the first semiconductor pattern may be a source or a drain of the transistor, and the other portion of the first semiconductor pattern may be a connection electrode or a connection signal line.

As shown in FIG. 11B, a first electrode S1, a channel portion A1, and a second electrode D1 of a first transistor T1 may be formed from the first semiconductor pattern. The first electrode S1 and the second electrode D1 may extend in opposite directions to each other from the channel portion A1.

A first insulating layer 10 may be disposed on the buffer layer BFL. The first insulating layer 10 may cover the first semiconductor pattern. The first insulating layer 10 may be an inorganic layer and/or an organic layer and may have a single-layer or multi-layer structure. The first insulating layer 10 may include at least one selected from aluminum oxide, titanium oxide, silicon oxide, silicon oxynitride, zirconium oxide, and hafnium oxide. In an embodiment, the first insulating layer 10 may have a single-layer structure of a silicon oxide layer. Not only the first insulating layer 10, but also an insulating layer of the circuit layer DP_CL described later may be an inorganic layer and/or an organic layer and may have a single-layer or multi-layer structure. The inorganic layer may include at least one selected from the above-mentioned materials.

A third electrode G1 of the first transistor T1 may be disposed on the first insulating layer 10. The third electrode G1 may be a portion of a metal pattern. The third electrode G1 of the first transistor T1 may overlap the channel portion A1 of the first transistor T1. The third electrode G1 of the first transistor T1 may be used as a mask in a process of doping the first semiconductor pattern.

A second insulating layer 20 may be disposed on the first insulating layer 10 and may cover the third electrode G1. The second insulating layer 20 may be an inorganic layer and/or an organic layer and may have a single-layer or multi-layer structure. In an embodiment, the second insulating layer 20 may have a single-layer structure of a silicon oxide layer.

An upper electrode UE may be disposed on the second insulating layer 20. The upper electrode UE may overlap the third electrode G1. The upper electrode UE may be a portion of a metal pattern or a portion of the doped semiconductor pattern. A portion of the third electrode G1 and the upper electrode UE overlapping the portion of the third electrode G1 may define a capacitor. According to an alternative embodiment, the upper electrode UE may be omitted.

The gate electrode PTGa of the phototransistor PTa may be disposed on the second insulating layer 20. The gate electrode PTGa may be a portion of a metal pattern. According to an embodiment, the gate electrode PTGa may include titanium (Ti), silver (Ag), an alloy including silver, molybdenum (Mo), an alloy containing molybdenum, aluminum (Al), an alloy including aluminum, aluminum nitride (AlN), tungsten (W), tungsten nitride (WN), copper (Cu), indium tin oxide (ITO), indium zinc oxide (IZO), or the like, however, it should not be particularly limited. The gate electrode PTGa may be formed through a same process as the upper electrode UE.

According to an embodiment, the second insulating layer 20 may be replaced with an insulating pattern. The upper electrode UE may be disposed on the insulating pattern. The upper electrode UE and the gate electrode PTGa may serve as a mask used to form the insulating pattern from the second insulating layer 20.

A third insulating layer 30 may be disposed on the second insulating layer 20 to cover the upper electrode UE and the gate electrode PTGa. The third insulating layer 30 may have a single-layer structure of a silicon oxide layer. The semiconductor pattern may be disposed on the third insulating layer 30. Hereinafter, the semiconductor pattern disposed directly on the third insulating layer 30 is referred to as a second semiconductor pattern. The second semiconductor pattern may include oxide semiconductor. The oxide semiconductor may include a crystalline or amorphous oxide semiconductor. In an embodiment, for example, the oxide semiconductor may include the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

FIG. 11B shows only a portion of the second semiconductor pattern, and a third semiconductor pattern may be further disposed in other areas of the pixel. The second semiconductor pattern may include a plurality of areas distinguished from each other depending on whether the metal oxide is reduced or not. An area (hereinafter, referred to as a reduced area) where the metal oxide is reduced may have a conductivity higher than that of an area (hereinafter, referred to as a non-reduced area) where the metal oxide is not reduced. The reduced area may substantially act as the electrode or the signal line. The non-reduced area may substantially correspond to a semiconductor layer of the transistor. In other words, a portion of the second semiconductor pattern may be the semiconductor layer of the phototransistor PTa, and another portion of the second semiconductor pattern may be the source electrode SEa or the drain electrode DEa of the phototransistor PTa.

The circuit layer DP_CL may further include elements included in the sensor driving circuit SD (refer to FIG. 11A). For the convenience of illustration and description, the sensor driving circuit SD is omitted in FIG. 11B.

The source electrode SEa, a semiconductor layer SCLa, and the drain electrode DEa of the phototransistor PTa may be formed from (or defined by portions of) the second semiconductor pattern. The semiconductor layer SCLa may include or be formed of amorphous silicon or oxide semiconductor. According to an embodiment, the semiconductor layer SCLa may include a crystalline or amorphous oxide semiconductor. In an embodiment, for example, the oxide semiconductor may include the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

The source electrode SEa and the drain electrode DEa may be spaced apart from each other with the semiconductor layer SCLa interposed therebetween. According to an embodiment, the source electrode SEa may be disposed to be in contact with one side of the semiconductor layer SCLa, and the drain electrode DEa may be disposed to be in contact with the other side of the semiconductor layer SCLa. Accordingly, the source electrode SEa and the drain electrode DEa may extend in opposite directions to each other from the semiconductor layer SCLa. The source electrode SEa and the drain electrode DEa may include a metal material, such as copper (Cu), aluminum (Al), nickel (Ni), chromium (Cr), etc., but they should not be particularly limited.

A fourth insulating layer 40 may be disposed to cover the source electrode SEa, the semiconductor layer SCLa, and the drain electrode DEa of the phototransistor PTa. According to an embodiment, the fourth insulating layer 40 may have a porous structure in which a plurality of holes HSb is defined through the fourth insulating layer 40 to overlap the source electrode SEa, the semiconductor layer SCLa, and the drain electrode DEa. The fourth insulating layer 40 may be an organic layer including the organic material, however, it should not be limited thereto or thereby. According to an alternative embodiment, the fourth insulating layer 40 may be an inorganic layer including an inorganic material or may have a multi-layer structure in which an organic layer and an inorganic layer are stacked. As described above, the fourth insulating layer 40 may correspond to the porous layer PL shown in FIG. 1A.

Referring to FIG. 11B, the holes HSb may be defined or arranged spaced apart from each other when viewed in the plan view. In an embodiment, for example, the holes HSb may be spaced apart from each other at regular intervals when viewed in the plan view, however, they should not be limited thereto or thereby. According to an alternative embodiment, the holes HSb may be arranged irregularly at different intervals from each other. According to an embodiment, the holes HSb may have a same size as each other when viewed in the plan view. In an embodiment, for example, the size of each of the holes HSb may be equal to or greater than about 10 nm and equal to or smaller than about 1000 nm, however, it should not be limited thereto or thereby. According to an alternative embodiment, the holes HSb may have different sizes from each other when viewed in the plan view. According to an embodiment, the holes HSb may be formed completely through the fourth insulating layer 40, however, they should not be limited thereto or thereby. According to an alternative embodiment, the holes HSb may be formed partially through the fourth insulating layer 40 by recessing the fourth insulating layer 40 from an upper surface of the fourth insulating layer 40.

According to an embodiment, as the fourth insulating layer 40 includes the plurality of holes HSb, the amount of the external light provided to the semiconductor layer SCLa may increase by collecting or by internally scattering the external light provided to the phototransistor PTa. In such an embodiment, the light absorption rate of the phototransistor PTa may be controlled by adjusting the size and the number of the holes HSb defined through the fourth insulating layer 40.

A fifth insulating layer 50 may be disposed on the fourth insulating layer 40. The fifth insulating layer 50 may include a silicon oxide layer and a silicon nitride layer. The fifth insulating layer 50 may include silicon oxide layers and silicon nitride layers alternately stacked with the silicon oxide layers. Alternatively, the fifth insulating layer 50 may be omitted.

At least one insulating layer may be further disposed on the fifth insulating layer 50. A sixth insulating layer 60 and a seventh insulating layer 70 may be disposed on the fifth insulating layer 50. Each of the sixth insulating layer 60 and the seventh insulating layer 70 may be an organic layer and may have a single-layer or multi-layer structure. Each of the sixth insulating layer 60 and the seventh insulating layer 70 may have a single-layer structure of a polyimide-based resin layer, however, they should not be limited thereto or thereby. According to an embodiment, each of the sixth insulating layer 60 and the seventh insulating layer 70 may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE10 may be disposed on the fifth insulating layer 50. The first connection electrode CNE10 may be connected to a connection signal line CSL through a first contact hole CH1 defined through the first to fifth insulating layers 10 to 50, and a second connection electrode CNE20 may be connected to the first connection electrode CNE10 through a second contact hole CH2 defined through the sixth insulating layer 60. According to an alternative embodiment of the disclosure, at least one selected from the fifth, sixth, and seventh insulating layers 50, 60, and 70 may be omitted, and one selected from the first and second connection electrodes CNE10 and CNE20 may be omitted.

The display element layer DP_ED may be disposed on the circuit layer DP_CL. The display element layer DP_ED may include an anode electrode E_AE of the light emitting element LD (refer to FIG. 11A). As shown in FIG. 11B, the anode electrode E_AE may be connected to the second connection electrode CNE20 via a fifth contact hole CH5 defined through the seventh insulating layer 70.

The display element layer DP_ED may further include a pixel definition layer PDL disposed on the circuit layer DP_CL. The pixel definition layer PDL may be provided with a light emitting opening OP1 defined therethrough to correspond to the light emitting element LD. At least a portion of the anode electrode E_AE of the light emitting element LD may be exposed through the light emitting opening OP1. The light emitting opening OP1 of the pixel definition layer PDL may define a light emitting area PXA. In an embodiment, for example, the pixels PX (refer to FIG. 11A) may be arranged in a certain rule in the display panel DP (refer to FIG. 10) when viewed in the plan view. An area in which the pixels PX are arranged may be defined as a pixel area, and one pixel area may include the light emitting area PXA and a non-light-emitting area NPXA adjacent to the light emitting area PXA. The non-light-emitting area NPXA may surround the light emitting area PXA.

A common layer CML may be disposed on the pixel definition layer PDL. The common layer CML may include a common cathode electrode C_CE, a hole control layer HCL, and an electron control layer ECL. The common cathode electrode C_CE may be commonly connected to the light emitting element LD. The common cathode electrode C_CE may face the sensing anode electrode O_AE and the anode electrode E_AE. The hole control layer HCL and the electron control layer ECL may be disposed between the pixel definition layer PDL and the common cathode electrode C_CE. The hole control layer HCL may include a hole transport layer and a hole injection layer, and the electron control layer ECL may include an electron transport layer and an electron injection layer.

A light emitting layer EL may be disposed to correspond to the light emitting opening OP1 defined through the pixel definition layer PDL. In an embodiment, as shown in FIG. 11B, the light emitting layer EL may have a patterned shape, however, the disclosure should not be limited thereto or thereby. Alternatively, a common light emitting layer may be commonly disposed over the plurality of pixels PX. In such an embodiment, the common light emitting layer may generate a white light or a blue light. The light emitting layer EL may be disposed on the hole control layer HCL. The electron control layer ECL may be disposed on the light emitting layer EL. The common cathode electrode C_CE may be disposed on the electron control layer ECL. The hole control layer HCL, the electron control layer ECL, and the common cathode electrode C_CE may be commonly disposed over the plurality of pixels PX.

Figure 12A:
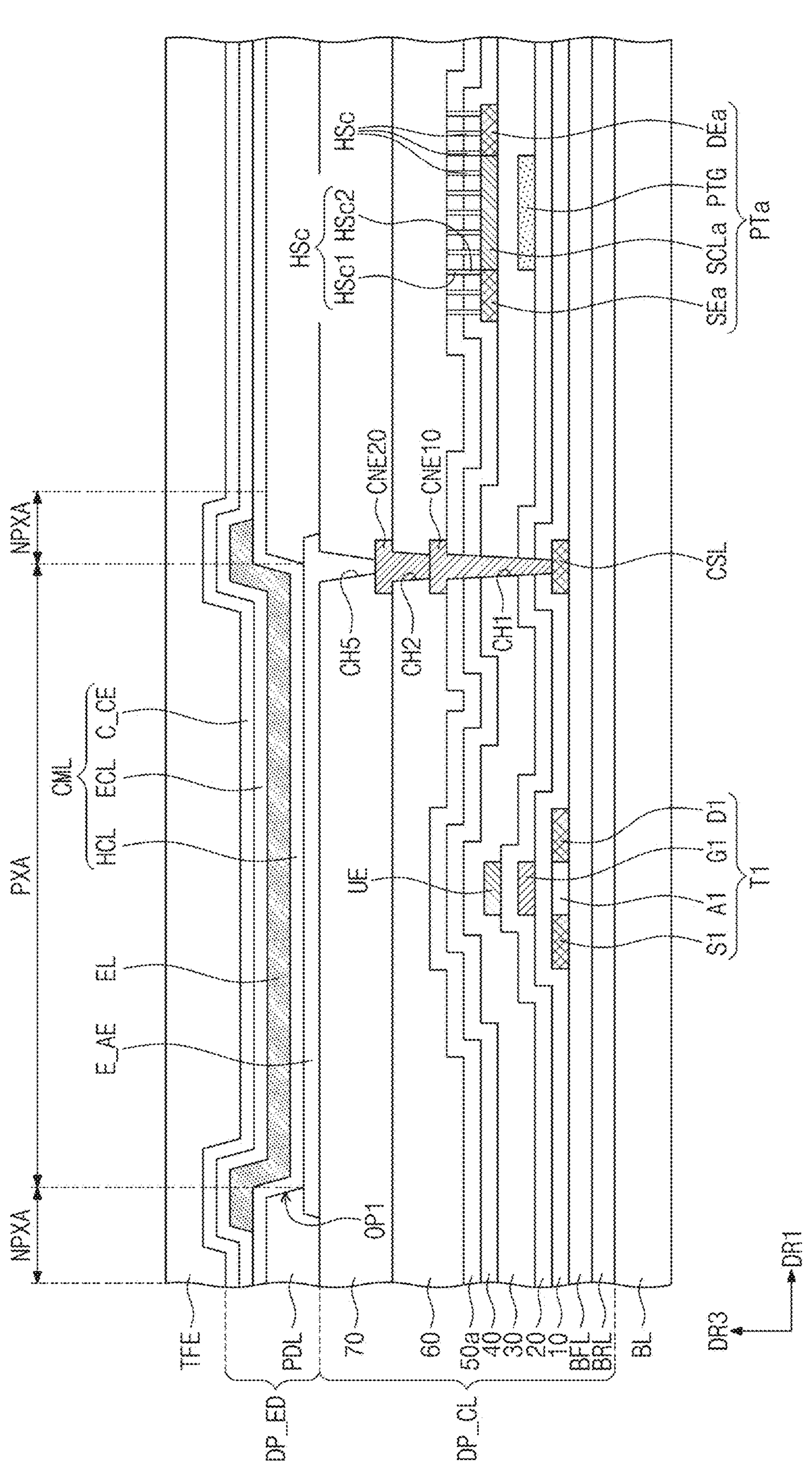
FIGS. 12A and 12B are cross-sectional views of display panels according to alternative embodiments of the disclosure.
Figure 12B:
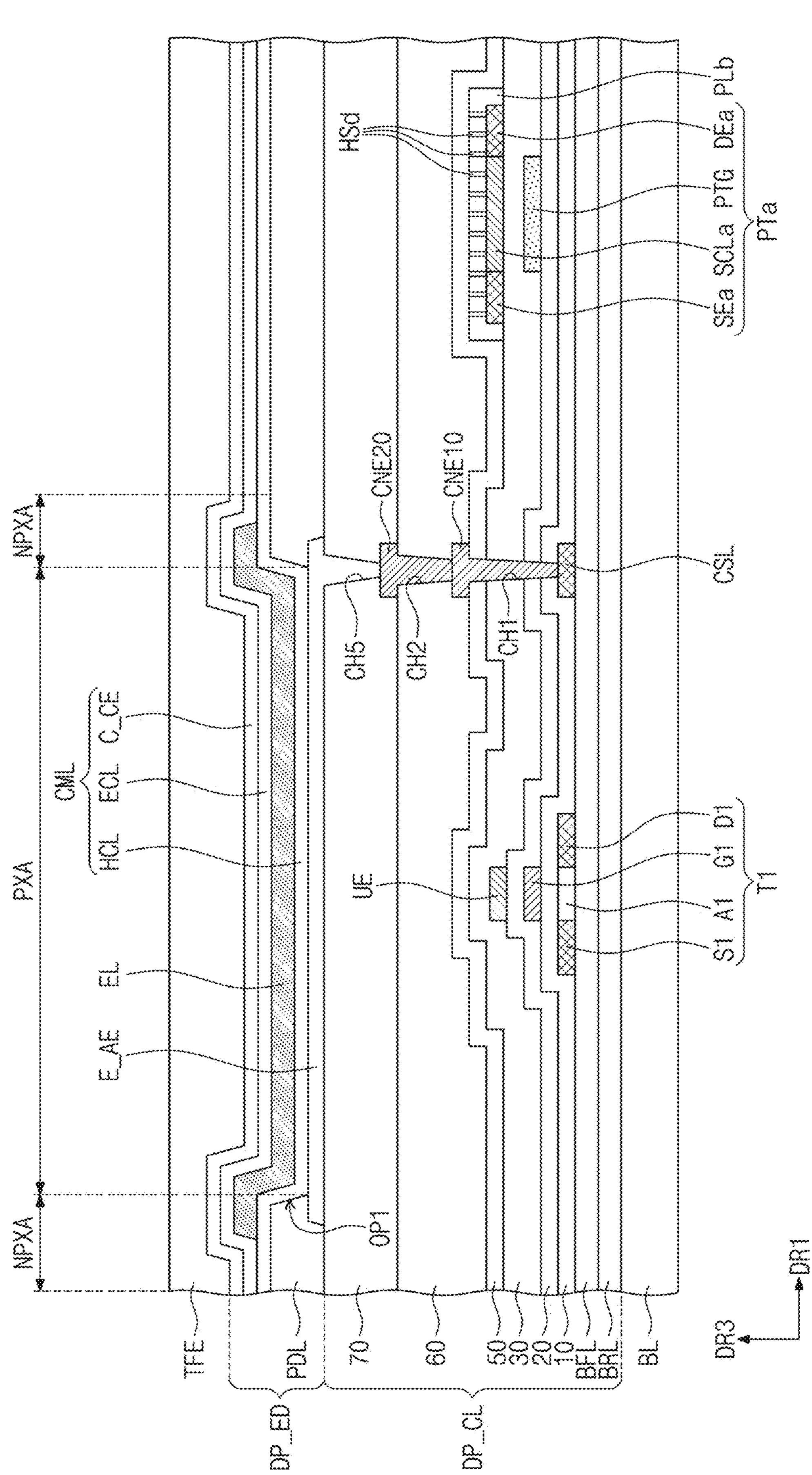

FIGS. 12A and 12B are cross-sectional views of display panels according to alternative embodiments of the disclosure. In FIGS. 12A and 12B, any repetitive detailed description of the same elements as those shown in FIG. 11B will be omitted.

Referring to FIG. 12A, a plurality of holes HSc may be defined or formed through a fifth insulating layer 50*a* and a fourth insulating layer 40. The holes HSc may include a plurality of first sub-holes HSc1 defined or formed through the fifth insulating layer 50*a* and a plurality of second sub-holes HSc2 defined or formed through the fourth insulating layer 40. The first and second sub-holes HSc1 and HSc2 may be aligned with each other. As shown in FIG. 12A, the holes HSc may be defined or formed through the fifth insulating layer 50*a* and the fourth insulating layer 40, however, they should not be limited thereto or thereby. According to an alternative embodiment, the first sub-holes HSc1 may be formed completely through the fifth insulating layer 50*a*, and the second sub-holes HSc2 may be formed partially through the fourth insulating layer 40 by recessing the fourth insulating layer 40 from an upper surface of the fourth insulating layer 40.

The fifth insulating layer 50*a* may be an inorganic layer including an inorganic material. In an embodiment, for example, the fifth insulating layer 50*a* may include at least one selected from aluminum oxide, titanium oxide, silicon oxide, silicon nitride, silicon oxynitride, zirconium oxide, and hafnium oxide. The fifth insulating layer 50*a* may have a single-layer structure of hafnium oxide, however, it should not be limited thereto or thereby. The fifth insulating layer 50*a* may have a single-layer or multi-layer structure and may include at least one material selected from the above-mentioned materials, however, it should not be limited thereto or thereby. As described above, the fourth insulating layer 40 may correspond to the first sub-porous layer PSL1 (refer to FIG. 2A), and the fifth insulating layer 50*a* may correspond to the second sub-porous layer PSL2 (refer to FIG. 2A).

Referring to FIG. 12B, in an alternative embodiment, the fourth insulating layer 40 may be omitted, and a separate porous layer PLb may be provided. In such an embodiment, the porous layer PLb through which a plurality of holes HSd is defined may be disposed or formed on a source electrode SEa, a semiconductor layer SCLa, and a drain electrode DEa. According to an embodiment, the porous layer PLb may be an organic layer including an organic material, however, it should not be limited thereto or thereby. According to an alternative embodiment, the porous layer PLb may be an inorganic layer including an inorganic material or may have a structure in which an organic layer and an inorganic layer are stacked. The porous layer PLb may be formed through a separate process from a fifth insulating layer 50, and the fifth insulating layer 50 may be disposed on the porous layer PLb.

Figure 13A:
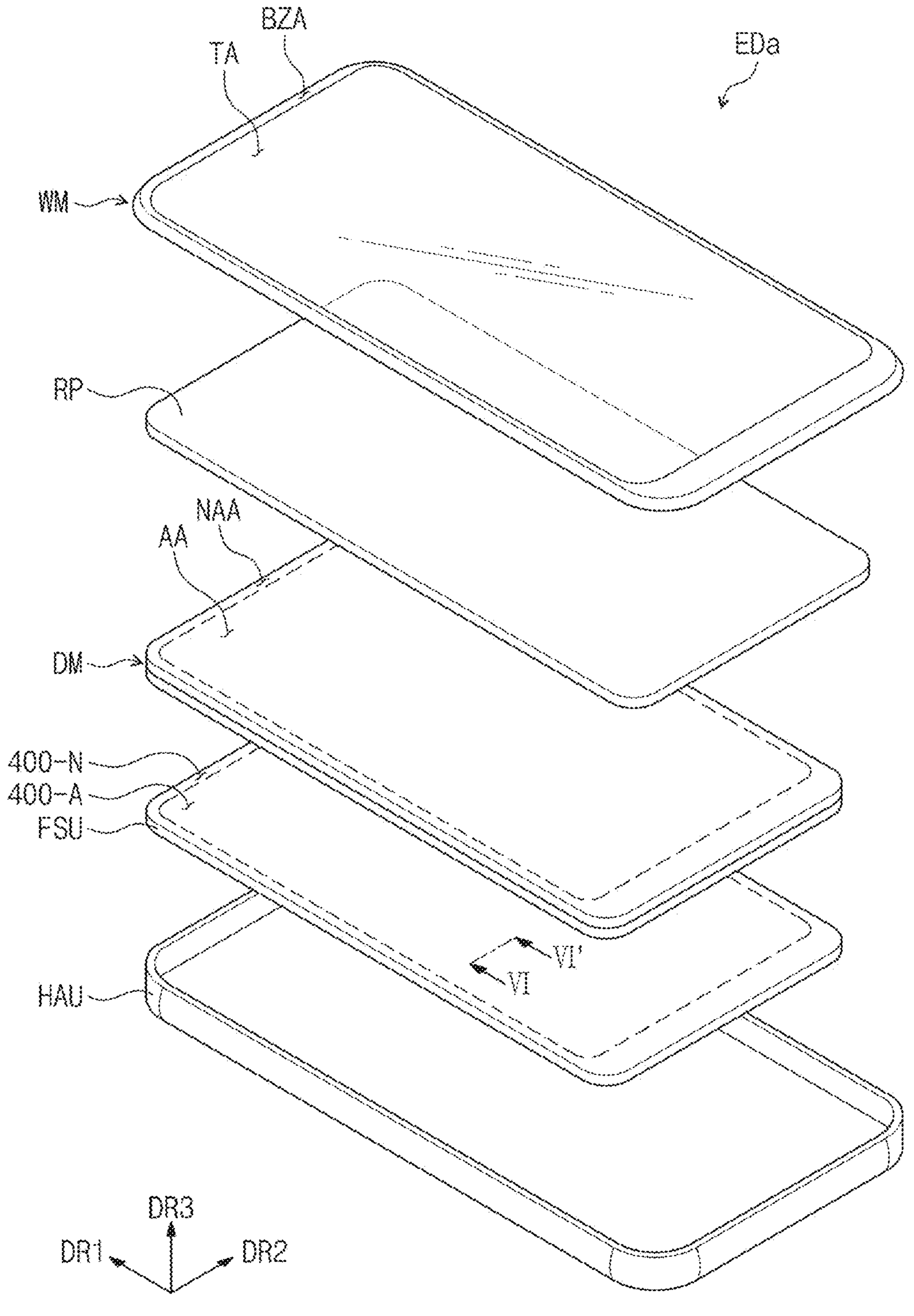
FIG. 13A is an exploded perspective view of an electronic device according to an embodiment of the disclosure.
Figure 13B:
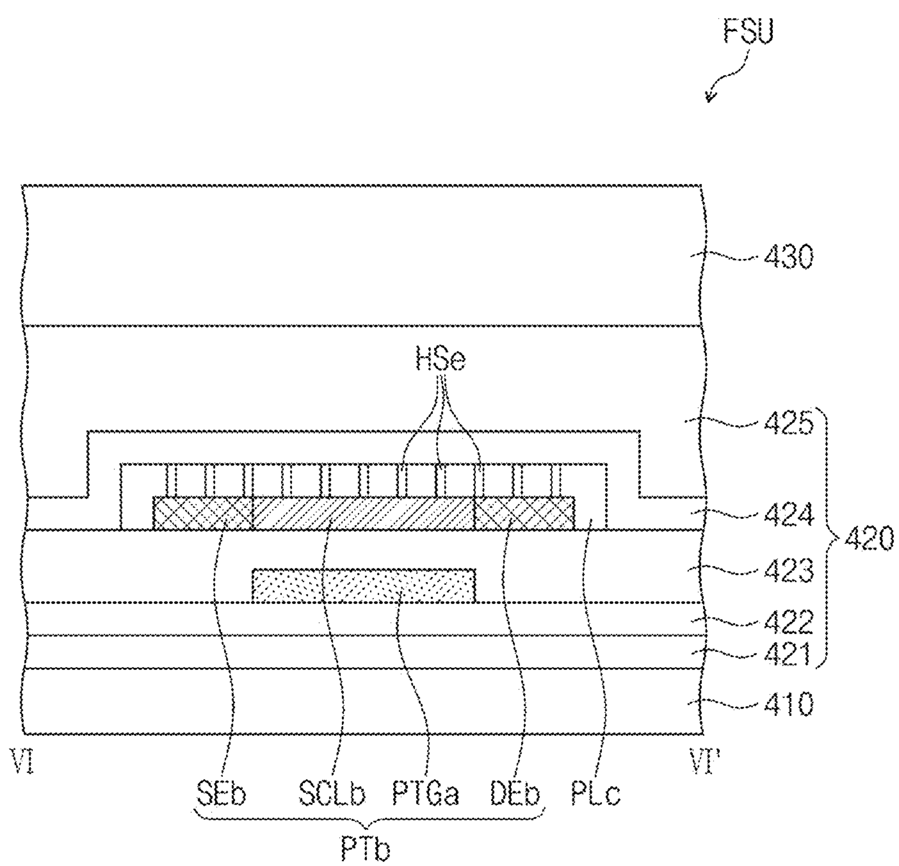
FIG. 13B is a cross-sectional view taken along line VI-VI' of FIG. 13A.

FIG. 13A is an exploded perspective view of an electronic device EDa according to an embodiment of the disclosure, and FIG. 13B is a cross-sectional view taken along line VI-VI' of FIG. 13A.

Referring to FIG. 13A, the electronic device EDa may include a window WM, an anti-reflective layer RP, a display module DM, a sensing unit FSU, and a housing HAU. The display module DM may be disposed under the window WM.

The anti-reflective layer RP may be disposed under the window WM. The anti-reflective layer RP may reduce a reflectance with respect to an external light incident thereto from the above of the window WM. According to an alternative embodiment, the anti-reflective layer RP may be omitted or may be included (or integrally formed) in the display module DM.

The sensing unit FSU may be disposed under the display module DM. The sensing unit FSU may sense user's biometric information. The sensing unit FSU may sense a surface of an object that touches the sensing unit FSU. The information with respect to the surface, which is sensed by the sensing unit FSU, may include a surface uniformity or a shape of surface curvature.

The sensing unit FSU may include a sensing area 400-A and a non-sensing area 400-N. The sensing area 400-A may be activated in response to electrical signals. In an embodiment, for example, the biometric information may be sensed in the sensing area 400-A. A driving circuit or a driving line to drive the sensing area 400-A may be arranged in the non-sensing area 400-N.

According to an embodiment, the sensing area 400-A may entirely overlap an active area AA. In an embodiment, a fingerprint may be recognized throughout the active area AA. In such an embodiment, the user's fingerprint may be recognized in an entire area of the active area AA rather than in a specified and limited area, however, the disclosure should not be limited thereto or thereby. In an alternative embodiment, for example, according to an embodiment, the sensing unit FSU may overlap a portion of the active area AA.

The anti-reflective layer RP, the display module DM, and the sensing unit FSU may be accommodated in the housing HAU. The housing HAU may be coupled with the window WM to form an external appearance of the electronic device EDa.

Although not shown in FIG. 13A, a battery module may be disposed between the sensing unit FSU and the housing HAU to supply a power source used for an overall operation of the electronic device EDa.

Referring to FIG. 13B, the sensing unit FSU may include a sensing base layer 410, a sensor layer 420, and an optical pattern layer 430.

The sensing base layer 410 may include a synthetic resin layer. The synthetic resin layer may include a heat-curable resin. The synthetic resin layer may include a polyimide-based resin, however, a material for the synthetic resin layer should not be particularly limited. In an embodiment, for example, the sensing base layer 410 may include two polyimide-based resin layers and a barrier layer disposed between the two polyimide-based resin layers. The barrier layer may include amorphous silicon or silicon oxide.

The sensor layer 420 may be disposed on the sensing base layer 410. The sensor layer 420 may be referred to as a biometric information sensing layer. The sensor layer 420 may include a sensing circuit and insulating layers. The sensing circuit may include at least one transistor or one photodiode. According to an embodiment, the sensor layer 420 may include a phototransistor PTb including a porous layer PLc through which a plurality of holes HSe is defined. FIG. 13B shows only the phototransistor PTb included in the sensor layer 420.

A barrier layer 421 may be disposed on the sensing base layer 410. The barrier layer 421 may include an inorganic layer and/or an organic layer and may have a single-layer or multi-layer structure. The barrier layer 421 may include at least one selected from aluminum oxide, titanium oxide, silicon oxide, silicon oxynitride, zirconium oxide, and hafnium oxide. The barrier layer 421 may have a single-layer structure of a silicon oxide layer.

A buffer layer 422 may be disposed on the barrier layer 421. The buffer layer 422 may include an inorganic layer and/or an organic layer and may have a single-layer or multi-layer structure. In an embodiment, the buffer layer 422 may have a single-layer structure of a silicon oxide layer.

A gate electrode PTGa of the phototransistor PTb may be disposed on the buffer layer 422. The gate electrode PTGa may be a portion of a metal pattern. According to an embodiment, the gate electrode PTGa may include titanium (Ti), silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), indium tin oxide (ITO), indium zinc oxide (IZO), or the like, however, it should not be particularly limited.

According to an embodiment, the buffer layer 422 may be replaced with an insulating pattern. The gate electrode PTGa may serve as a mask when the insulating pattern is formed from the buffer layer 422.

A first sensing insulating layer 423 may be disposed on the buffer layer 422 to cover the gate electrode PTGa. In an embodiment, the first sensing insulating layer 423 may have a single-layer structure of a silicon oxide layer. A semiconductor pattern may be disposed on the first sensing insulating layer 423. The semiconductor pattern may include an oxide semiconductor. The oxide semiconductor may include a crystalline or amorphous oxide semiconductor. In an embodiment, for example, oxide semiconductor may include a metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

A source electrode SEb, a semiconductor layer SCLb, and a drain electrode DEb of the phototransistor PTb may be formed from the semiconductor pattern. The semiconductor layer SCLb may include or be formed of amorphous silicon or oxide semiconductor. According to an embodiment, the semiconductor layer SCLb may include a crystalline or amorphous oxide semiconductor. In an embodiment, for example, the oxide semiconductor may include a metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

The source electrode SEb and the drain electrode DEb may be spaced apart from each other with the semiconductor layer SCLb interposed therebetween. The source electrode SEb may be disposed to be in contact with one side of the semiconductor layer SCLb, and the drain electrode DEb may be disposed to be in contact with the other side of the semiconductor layer SCLb. Accordingly, the source electrode SEb and the drain electrode DEb may extend in opposite directions to each other from the semiconductor layer SCLb. The source electrode SEb and the drain electrode DEb may include a metal material, such as copper (Cu), aluminum (Al), nickel (Ni), chromium (Cr), etc., but they should not be particularly limited.

The porous layer PLc may be disposed on the source electrode SEb, the semiconductor layer SCLb, and the drain electrode DEb of the phototransistor PTb. In an embodiment, the porous layer PLc through which the holes HSe are defined may be disposed or formed on the source electrode SEb, the semiconductor layer SCLb, and the drain electrode DEb. According to an embodiment, the porous layer PLc may be an organic layer including an organic material, however, the disclosure should not be limited thereto or thereby. According to an alternative embodiment, the porous layer PLc may be an inorganic layer including an inorganic material or may have a structure in which an organic layer and an inorganic layer are stacked. The porous layer PLc may be formed through a separate process from a second sensing insulating layer 424, and the second sensing insulating layer 424 may be disposed on the porous layer PLc.

The second sensing insulating layer 424 may be disposed to cover the porous layer PLc. According to an embodiment, where the porous layer PLc is omitted, the second sensing insulating layer 424 may have a porous structure in which the holes HSe are defined or formed through the second sensing insulating layer 424 on the source electrode SEb, the semiconductor layer SCLb, and the drain electrode DEb. The second sensing insulating layer 424 may be an organic layer including an organic material, however, it should not be limited thereto or thereby. According to an embodiment, the second sensing insulating layer 424 may be an inorganic layer including an inorganic material or may have a multi-layer structure in which an organic layer and an inorganic layer are stacked.

Referring to FIG. 13B, the holes HSe may be arranged spaced apart from each other when viewed in the plan view. In an embodiment, for example, the holes HSe may be arranged spaced apart from each other at regular intervals when viewed in the plan view, however, they should not be limited thereto or thereby. According to an embodiment, the holes HSe may be arranged at different intervals. According to an embodiment, the holes HSe may have a same size as each other when viewed in the plan view. In an embodiment, for example, the size of the holes HSe may be equal to or greater than about 10 nm and equal to or smaller than about 1000 nm, however, it should not be limited thereto or thereby. According to an embodiment, the holes HSe may have different sizes from each other when viewed in the plan view. According to an embodiment, the holes HSe may be formed completely through the second sensing insulating layer 424, however, they should not be limited thereto or thereby. According to an alternative embodiment, the holes HSe may be formed partially through the second sensing insulating layer 424 by recessing a portion of the second sensing insulating layer 424 from an upper surface of the second sensing insulating layer 424.

As the porous layer PLc includes the plurality of holes HSe, the amount of the external light provided to the semiconductor layer SCLb may increase by collecting or internally scattering the external light provided to the phototransistor PTb. In addition, the light absorption rate of the phototransistor PTb may be controlled by adjusting the size and the number of the holes HSe formed through the porous layer PLc.

A third sensing insulating layer 425 may be disposed on the second sensing insulating layer 424. In an embodiment, the third sensing insulating layer 425 may include a silicon oxide layer and a silicon nitride layer. The third sensing insulating layer 425 may include silicon oxide layers and silicon nitride layers alternately stacked with the silicon oxide layers. Alternatively, the third sensing insulating layer 425 may be omitted.

The optical pattern layer 430 may be disposed directly on the sensor layer 420. In an embodiment, for example, the optical pattern layer 430 and the sensor layer 420 may be formed through successive processes. The optical pattern layer 430 may filter a light incident into the sensor layer 420. In such an embodiment, an incident angle of the light that passes through the optical pattern layer 430 may be controlled by the optical pattern layer 430. In an embodiment, for example, the incident angle may be limited to a predetermined angle or less. As the incident angle is limited, an accuracy of the fingerprint recognition may be improved.

FIGS. 14A to 14F are views of a method of manufacturing the phototransistor according to an embodiment of the disclosure, and FIGS. 15A to 15E are cross-sectional views of the views of FIGS. 14A, 14B, 14C, 14E, and 14F, respectively. FIG. 16 is a view of a method of removing nanoparticles in the manufacturing of the phototransistor according to an embodiment of the disclosure.

Figure 14A:
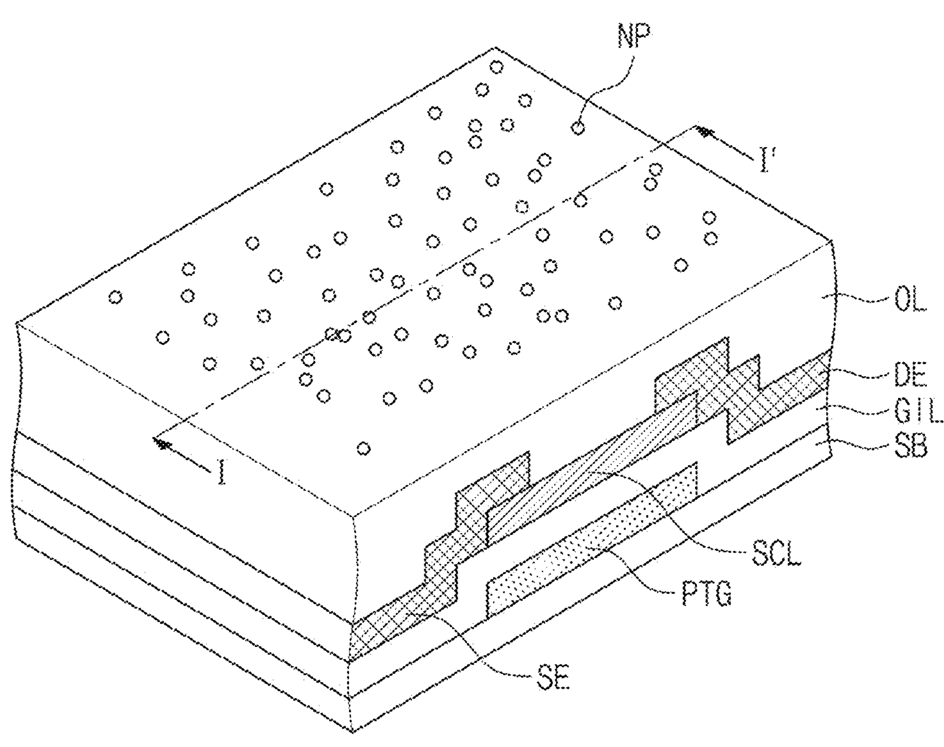
FIGS. 14A to 14F are views of a method of manufacturing a phototransistor according to an embodiment of the disclosure.

Referring to FIG. 14A, the gate electrode PTG may be formed on the substrate SB. The gate electrode PTG may be formed by forming a metal layer through a deposition process and patterning the metal layer through a photolithography process and an etching process. Then, at least one gate insulating layer GIL may be formed to cover the gate electrode PTG. A fluorinated gas may be used in the etching process to form the gate electrode PTG. After the etching process, fluorinated residues may exist on the gate insulating layer GIL or around the gate electrode PTG. The gate insulating layer GIL may serve as a barrier layer that prevents the fluorinated residues from being diffused.

Then, the semiconductor layer SCL may be formed on the gate insulating layer GIL. The semiconductor layer SCL may be formed through a sputtering process, and the semiconductor layer SCL may be patterned through a photolithography process and an etching process. According to an embodiment, the semiconductor layer SCL may include or be formed of crystalline silicon, amorphous silicon, or oxide semiconductor. The source electrode SE and the drain electrode DE may extend in opposite directions to each other from the semiconductor layer SCL. The source electrode SE and the drain electrode DE may include a metal material, such as copper (Cu), aluminum (Al), nickel (Ni), chromium (Cr), etc. After that, an organic layer OL may be formed on the semiconductor layer SCL. The organic layer OL may be disposed to cover the semiconductor layer SCL, the source electrode SE, and the drain electrode DE. FIG. 14A is a view showing a process of dispersing nanoparticles NP on the organic layer OL, and FIG. 15A is a cross-sectional view taken along line I-I' of FIG. 14A.

Figure 15A:
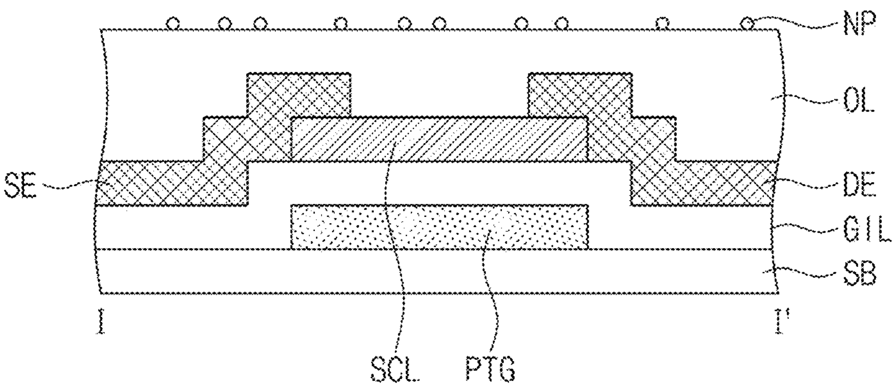
FIG. 15A is a cross-sectional view taken along line I-I' of FIG. 14A.
Figure 16:
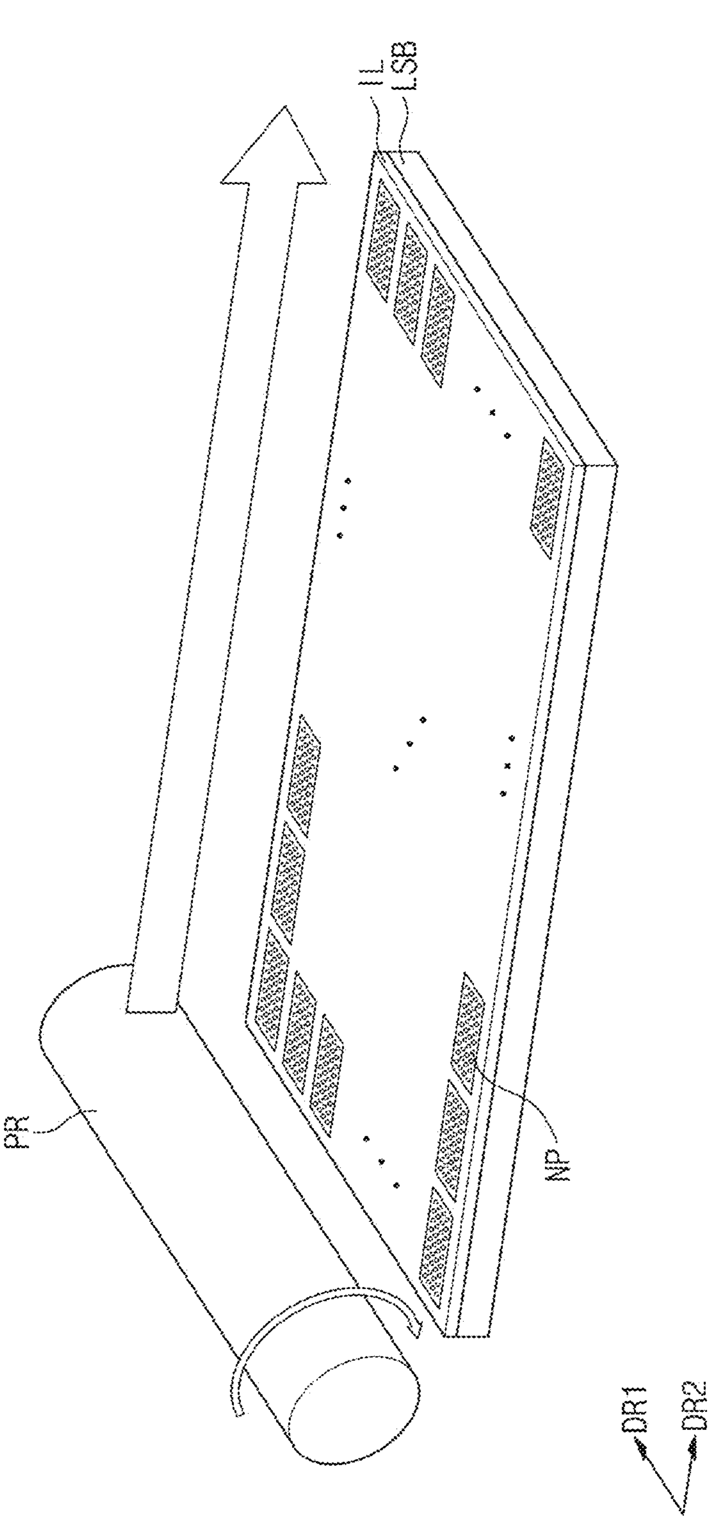
FIG. 16 is a view of a method of manufacturing a phototransistor according to an embodiment of the disclosure.

Referring to FIGS. 14A and 15A, the nanoparticles NP may be dispersed on the organic layer OL formed on the semiconductor layer SCL, the source electrode SE, and the drain electrode DE. In this process, the nanoparticles NP may be randomly provided on the organic layer OL and may not be fixed onto the organic layer OL. Accordingly, referring to FIG. 15A, distances between the nanoparticles NP may not be constant.

Figure 14B:
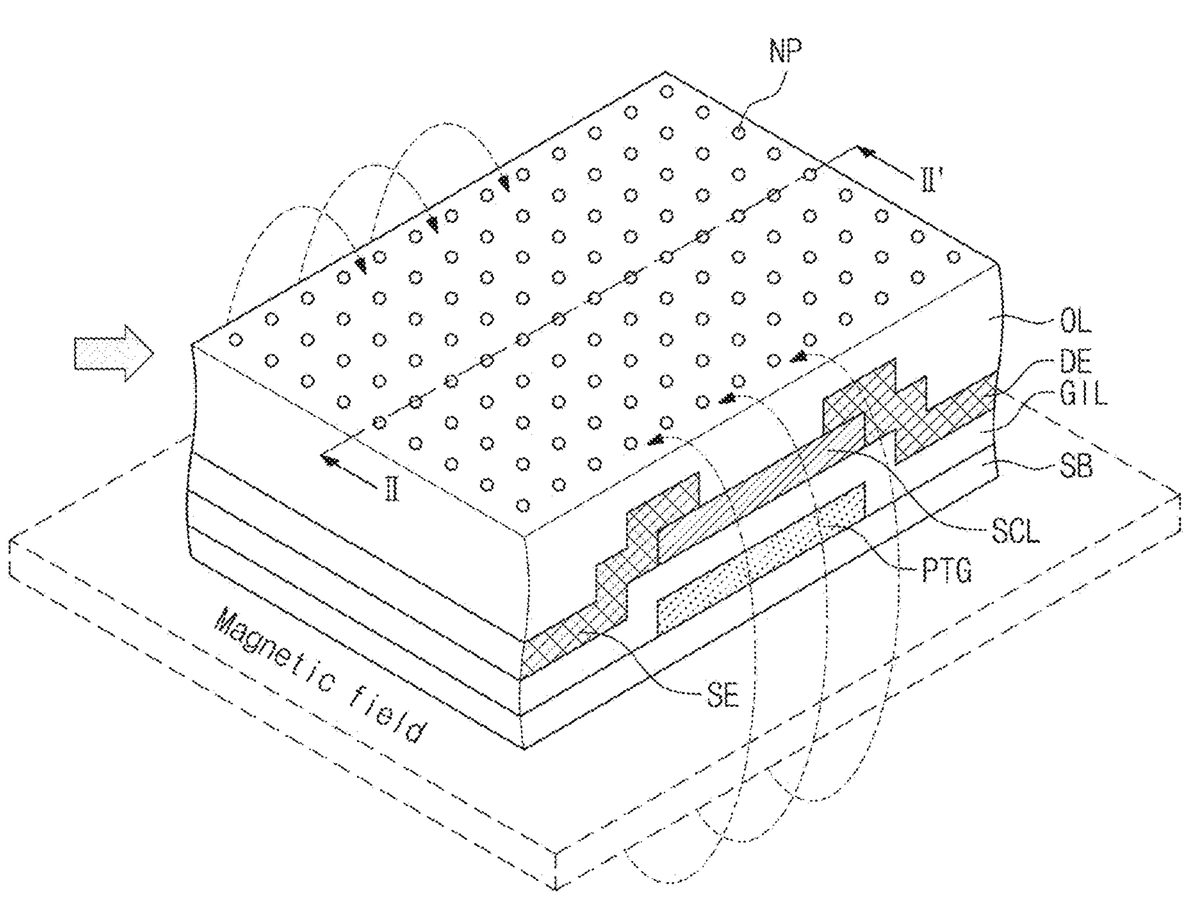
Figure 15B:
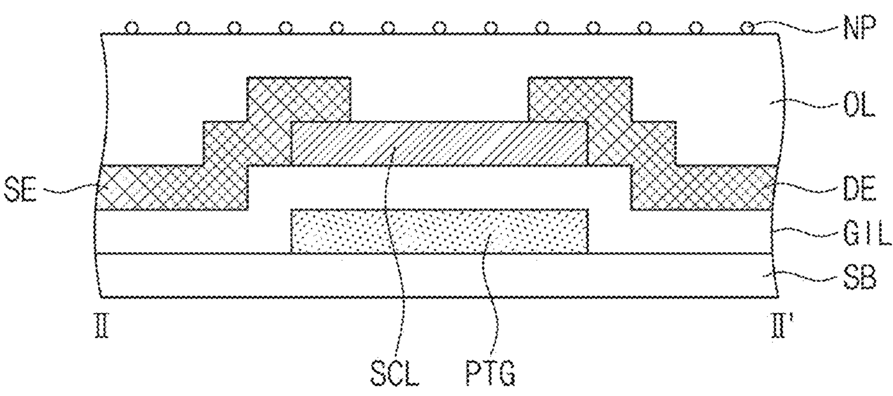
FIG. 15B is a cross-sectional view taken along line II-II' of FIG. 14B.

FIG. 14B is a view showing a process of aligning the nanoparticles NP using a magnetic field, and FIG. 15B is a cross-sectional view taken along line II-II' of FIG. 14B.

Referring to FIGS. 14B and 15B, the nanoparticles NP dispersed on the organic layer OL may be arranged in a certain pattern by the magnetic field generated under the substrate SB. According to an embodiment, as the nanoparticles NP include a metal material, the nanoparticles NP may have a magnetic property, and when the nanoparticles NP are provided in a space where a uniform magnetic field is formed, the nanoparticles NP may be rearranged in a direction in which the magnetic field is formed. As shown in FIGS. 14B and 15B, the nanoparticles NP may be arranged to be spaced apart from each other at regular intervals, however, they should not be limited thereto or thereby. According to an embodiment, the distance between the nanoparticles NP may not be constant depending on an intensity of the magnetic field and the direction in which the magnetic field is formed.

Figure 14C:
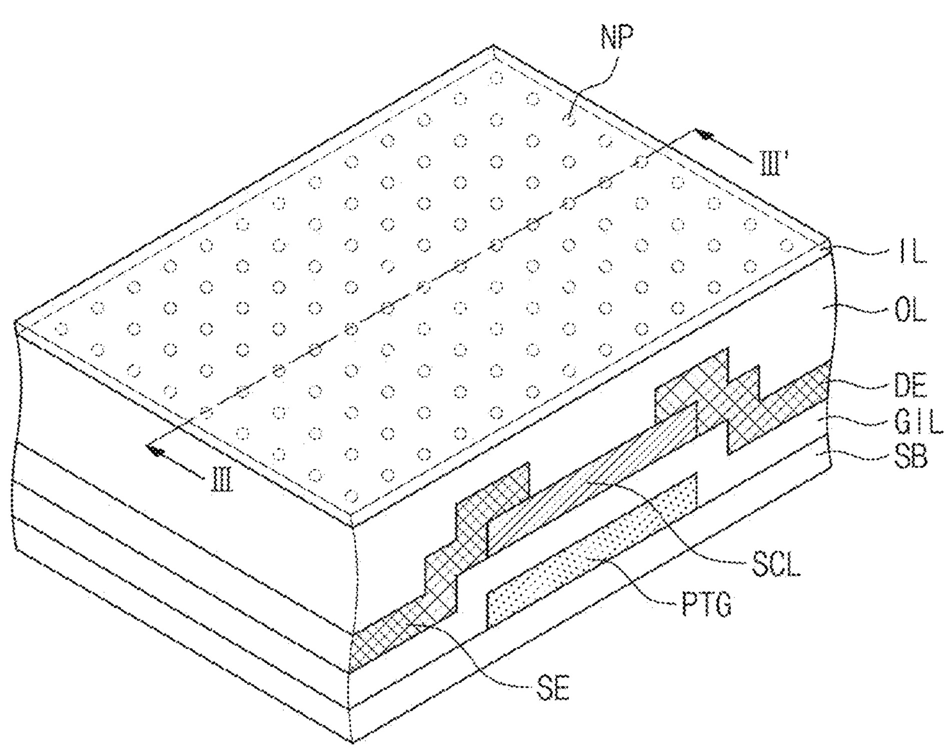
Figure 14D:
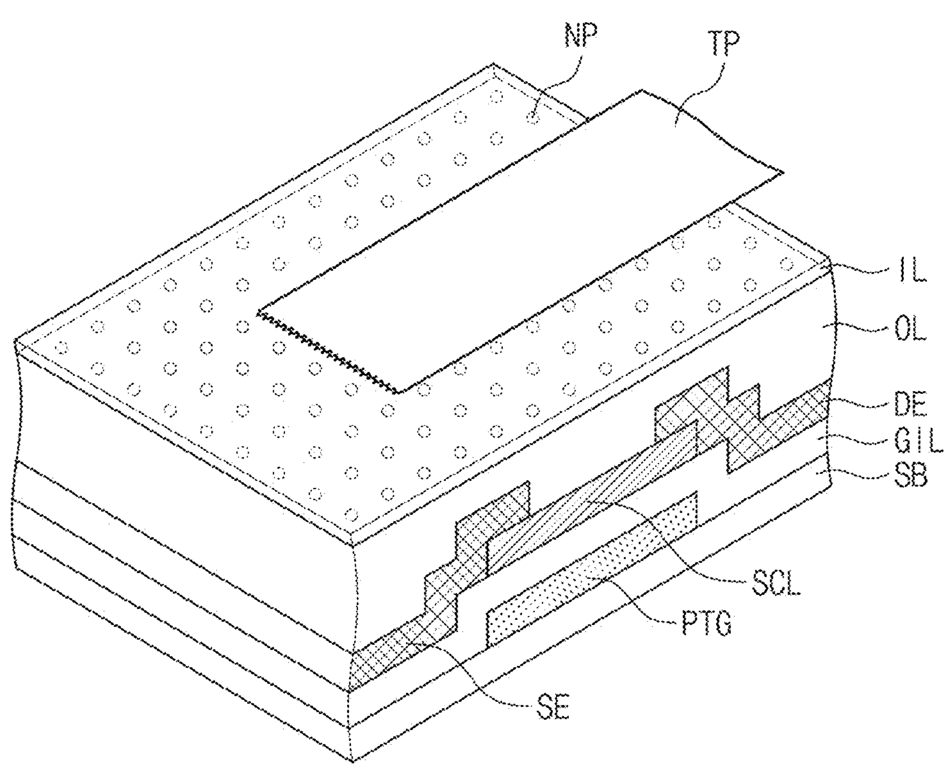
Figure 15C:
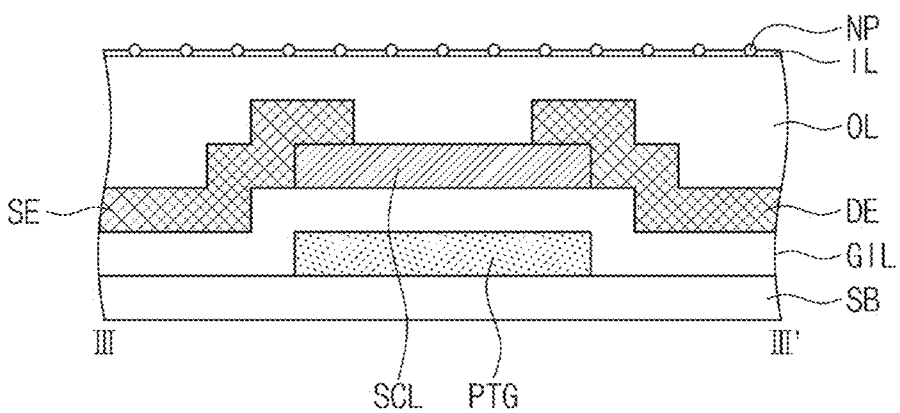
FIG. 15C is a cross-sectional view taken along line III-III' of FIG. 14C.

FIG. 14C is a view showing a process of placing an inorganic layer IL on the organic layer OL, and FIG. 14D is a view showing a process of removing the nanoparticles NP. FIG. 15C is a cross-sectional view taken along line III-III' of FIG. 14C.

Referring to FIGS. 14C and 15C, the inorganic layer IL may be formed on the organic layer OL through a coating or deposition process. The inorganic layer IL may be formed to fill the space where the nanoparticles NP are not disposed. In an embodiment, for example, the inorganic layer IL may have a thickness smaller than a diameter of the nanoparticles NP. In an embodiment, for example, the inorganic layer IL may have the thickness of about 51.2 nm, and the nanoparticles NP may have the diameter of about 155 nm. The nanoparticles NP may be fixed to the upper surface of the organic layer OL by the inorganic layer IL.

Referring to FIG. 14D, the nanoparticles NP may be removed using a tape TP having an adhesive layer formed on one surface thereof. In an embodiment, the adhesive layer of the tape TP may be placed to make contact with the nanoparticles NP protruded from the upper surface of the inorganic layer IL, the tape TP may be separated from the inorganic layer IL, and thus, only the nanoparticles NP may be selectively removed. In an embodiment, all nanoparticles NP may be removed at once in one separation process by adjusting a size of the tape TP, however, the disclosure should not be limited thereto or thereby. Alternatively, all the nanoparticles NP may be removed through two or more separation processes. The method of removing the nanoparticles NP should not be limited to the method using the tape. Alternatively, the nanoparticles NP may be selectively etched through a dry or wet etching process.

Referring to FIG. 16, in a case where a plurality of phototransistors is manufactured in a plurality of cell areas of a large-sized substrate LSB, a polymer roller PR may be disposed on the large-sized substrate LSB, and the nanoparticles NP dispersed in the cell areas may be removed through a single process using the polymer roller PR. In such an embodiment, as the polymer roller PR rotates while moving in the second direction DR2, the nanoparticles NP dispersed in the cell areas may be removed through a single process, and as a result, the process of removing the nanoparticles NP may be simplified.

Figure 14E:
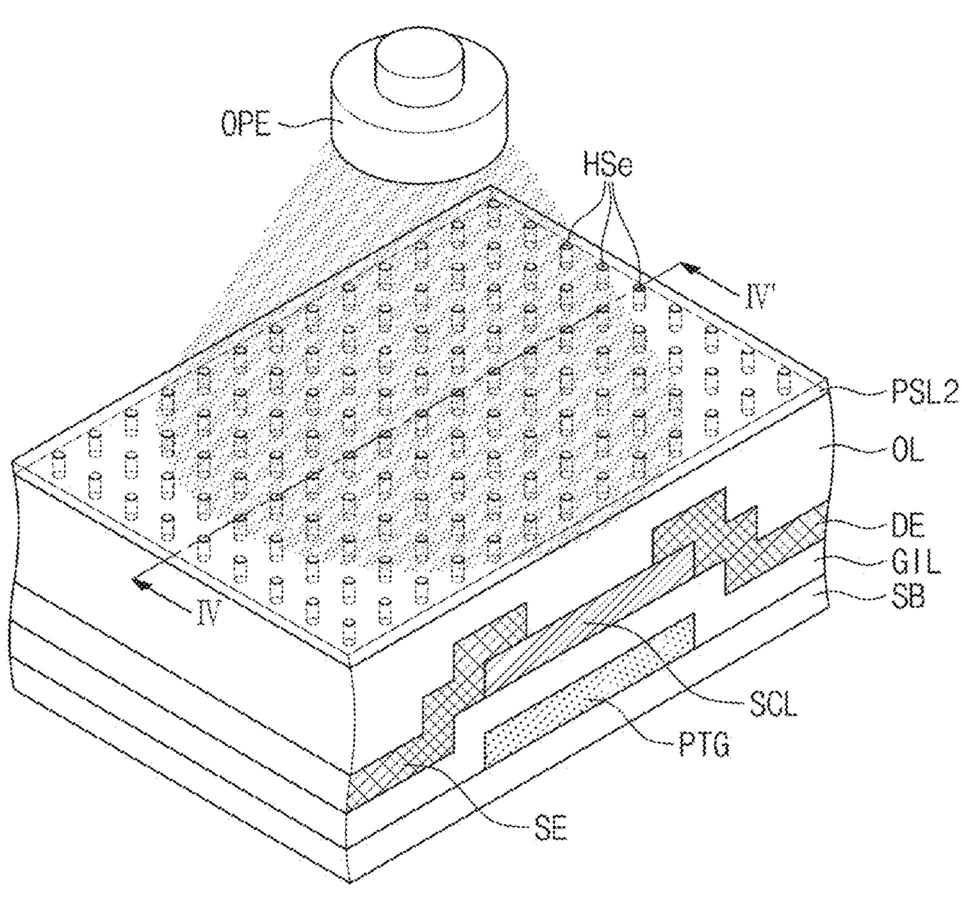
Figure 15D:
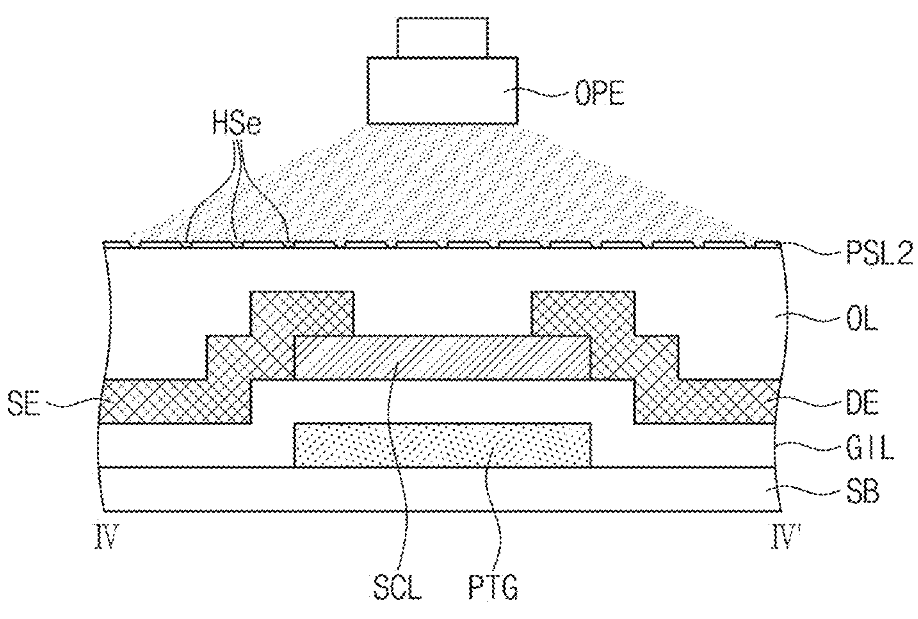
FIG. 15D is a cross-sectional view taken along line IV-IV' of FIG. 14E.

FIG. 14E is a view showing a process of patterning the organic layer, and FIG. 15D is a cross-sectional view taken along line IV-IV' of FIG. 14E.

When the nanoparticles NP disposed on the organic layer OL are removed, the second sub-porous layer PSL2 through which first sub-holes HSe are defined at positions where the nanoparticles NP were placed may be formed on the organic layer OL.

Referring to FIG. 15D, the first sub-holes HSe may have a same shape as that of a lower structure of the nanoparticles NP. Accordingly, each of the first sub-holes HSe may have a hemispherical shape as shown in FIG. 14E, however, it should not be limited thereto or thereby. According to an embodiment, the shape of the first sub-holes HSe may vary in various ways depending on the method of removing the nanoparticles NP.

Referring to FIGS. 14E and 15D, an ashing process may be performed with $O_2$ plasma generated by a plasma device OPE disposed above the second sub-porous layer PSL2. The plasma device OPE may perform a dry etching process, and the dry etching process may be performed by providing a sealed processing space in a vacuum chamber, placing a semiconductor wafer at a high-frequency side electrode, and supplying a gas for the generation of plasma from a gas supply electrode side opposite to the high-frequency side electrode. The patterning method using $O_2$ gas may be called as the ashing process and may be used to remove an organic material.

In an embodiment, as described above, the organic layer OL may be patterned through the ashing process using $O_2$ plasma. In such an embodiment, the second sub-porous layer PSL2 may serve as a mask in the process of patterning the organic layer OL during the ashing process. The second sub-porous layer PSL2 is desired to withstand exposure to the ashing process by $O_2$ plasma. The second sub-porous layer PSL2 may include at least one selected from aluminum oxide, titanium oxide, silicon oxide, silicon nitride, silicon oxynitride, zirconium oxide, and hafnium oxide. The second sub-porous layer PSL2 may have a single-layer structure of a hafnium oxide layer, however, it should not be limited thereto or thereby. In an embodiment, the second sub-porous layer PSL2 may have a single-layer or multi-layer structure and may include at least one selected from the above-mentioned materials, but it should not be limited thereto or thereby.

Figure 14F:
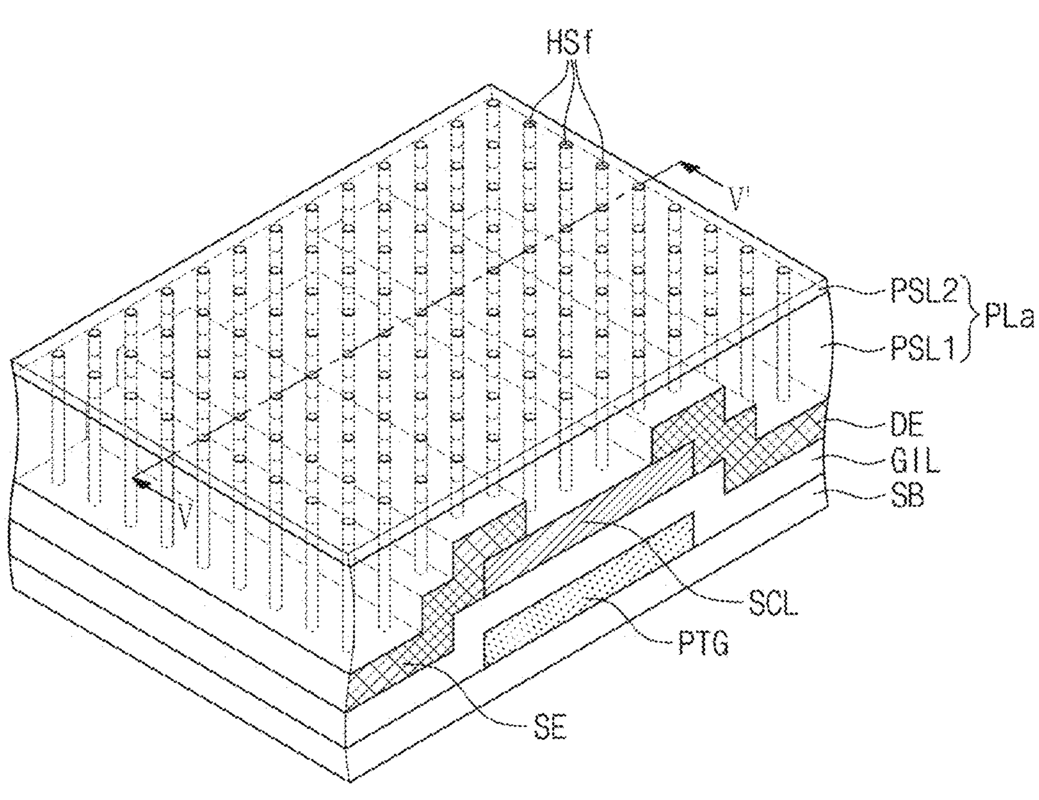
Figure 15E:
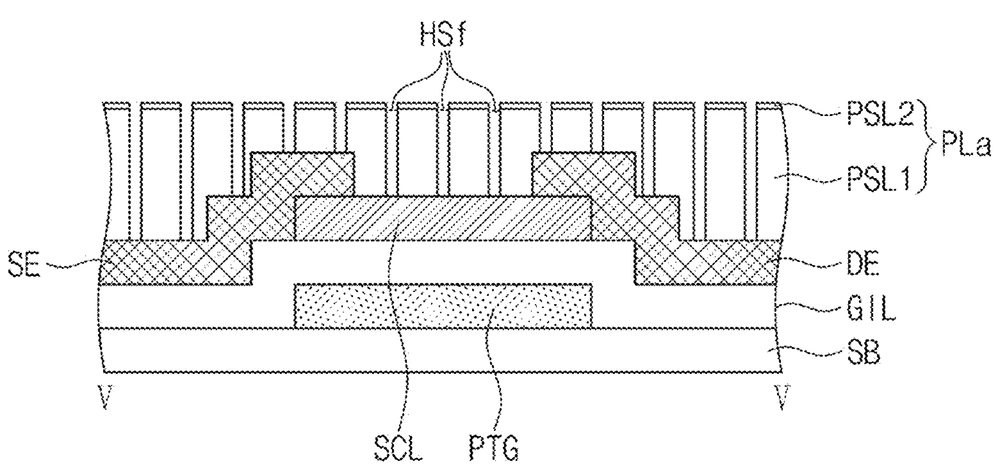
FIG. 15E is a cross-sectional view of a phototransistor taken along line V-V' of FIG. 14F.

FIG. 14F is a view showing the phototransistor including an organic layer through which the plurality of holes are defined, and FIG. 15E is a cross-sectional view of the phototransistor taken along line V-V' of FIG. 14F.

The organic layer OL (refer to FIG. 14E) may be patterned by $O_2$ plasma, and the first sub-porous layer PSL1 may be formed under the second sub-porous layer PSL2. The first sub-porous layer PSL1 may have a structure in which a plurality of second sub-holes HSf is formed through the organic layer OL. Accordingly, the porous layer PLa including the first sub-porous layer PSL1 and the second sub-porous layer PSL2 may be formed.

Although not shown in figures, the protective layer PTL (refer to FIGS. 3A and 3B) may be further formed on the porous layer PLa. The protective layer PTL may entirely cover the porous layer PLa to protect the semiconductor layer SCL from moisture, oxygen, and a foreign substance, e.g., dust particles.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A phototransistor comprising:

a gate electrode;

a semiconductor layer disposed on the gate electrode;

a gate insulating layer disposed between the gate electrode and the semiconductor layer;

a source electrode disposed on the semiconductor layer;

a drain electrode disposed on the semiconductor layer and spaced apart from the source electrode on the semiconductor layer; and a porous layer disposed on the source electrode, the semiconductor layer and the drain electrode, wherein a plurality of holes is defined through the porous layer to expose the semiconductor layer.

2. The phototransistor of claim 1, wherein the semiconductor layer comprises an oxide semiconductor.

3. The phototransistor of claim 1, wherein the porous layer comprises an organic material.

4. The phototransistor of claim 1, wherein the porous layer comprises:

a first sub-porous layer comprising an organic material; and a second sub-porous layer disposed on the first sub-porous layer and comprising an inorganic material, and wherein the holes comprise:

a first sub-hole defined through the second sub-porous layer; and a second sub-hole defined through the first sub-porous layer.

5. The phototransistor of claim 1, further comprising:

a protective layer disposed on the porous layer.

6. The phototransistor of claim 1, wherein a portion of the semiconductor layer where the semiconductor layer overlaps the source electrode and the drain electrode is defined as a first portion, a portion of the semiconductor layer where the semiconductor layer does not overlap the source electrode and the drain electrode is defined as a second portion, and the holes overlap the first and second portions.

7. The phototransistor of claim 6, wherein the source electrode and the drain electrode comprise a transparent conductive material.

8. The phototransistor of claim 1, wherein the holes are arranged spaced apart from each other when viewed in a plan view, and the holes have a same size as each other when viewed in the plan view.

9. The phototransistor of claim 1, wherein the holes are defined through the porous layer.

* * * * *